(12) United States Patent
Kirby

(10) Patent No.: US 7,364,985 B2
(45) Date of Patent: Apr. 29, 2008

(54) METHOD FOR CREATING ELECTRICAL PATHWAYS FOR SEMICONDUCTOR DEVICE STRUCTURES USING LASER MACHINING PROCESSES

(75) Inventor: Kyle K. Kirby, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 194 days.

(21) Appl. No.: 10/673,692

(22) Filed: Sep. 29, 2003

(65) Prior Publication Data

US 2005/0070092 A1 Mar. 31, 2005

(51) Int. Cl.
*H01L 21/00* (2006.01)
(52) U.S. Cl. .................... 438/463; 438/462; 438/597; 438/690; 257/E21.347; 257/E21.475
(58) Field of Classification Search ............... 438/690, 438/597, 618, 462, 463, 473; 257/E21.347, 257/E21.475
See application file for complete search history.

(56) References Cited

U.S. PATENT DOCUMENTS

| | | | |
|---|---|---|---|
| 6,107,109 A | 8/2000 | Akram et al. | |
| 6,114,240 A | 9/2000 | Akram et al. | |
| 6,294,837 B1 | 9/2001 | Akram et al. | |
| 6,313,434 B1 * | 11/2001 | Patterson et al. | 219/121.69 |
| 6,313,531 B1 | 11/2001 | Geusic et al. | |
| 6,429,037 B1 * | 8/2002 | Wenham et al. | 438/57 |
| 6,495,448 B1 | 12/2002 | Lee | |
| 6,527,965 B1 * | 3/2003 | Gee et al. | 216/24 |
| 6,773,938 B2 * | 8/2004 | Wood et al. | 438/15 |
| 6,815,709 B2 * | 11/2004 | Clothier et al. | 257/40 |
| 2002/0011641 A1 * | 1/2002 | Oswald et al. | 257/447 |
| 2002/0180013 A1 * | 12/2002 | Brofman et al. | 257/678 |
| 2004/0040149 A1 * | 3/2004 | Wood et al. | 29/852 |
| 2004/0043607 A1 * | 3/2004 | Farnworth et al. | 438/667 |
| 2004/0088855 A1 * | 5/2004 | Akram | 29/840 |
| 2005/0046431 A1 * | 3/2005 | Kirby | 324/754 |
| 2005/0064707 A1 * | 3/2005 | Sinha | 438/667 |

* cited by examiner

*Primary Examiner*—Michelle Estrada
(74) *Attorney, Agent, or Firm*—TraskBritt

(57) ABSTRACT

A method for creating electrical pathways for semiconductor device structures using laser machining processes is provided. The method of the present invention includes providing a semiconductor substrate and forming one or more depressions in the semiconductor substrate using laser machining processes. Optionally, a film may be deposited over the semiconductor substrate and the depressions may be formed therein. Subsequently, the semiconductor substrate and/or film are etched to smooth out the depressions and the depressions are then filled with an electrically conductive material. The electrically conductive material is then planarized down to the surface of the semiconductor substrate or film thereby isolating the electrically conductive material in the depressions.

27 Claims, 18 Drawing Sheets

METHOD FOR CREATING ELECTRICAL PATHWAYS FOR SEMICONDUCTOR DEVICE STRUCTURES USING LASER MACHINING PROCESSES

BACKGROUND OF THE INVENTION

1. Field of the Invention

The present invention relates generally to the fabrication of semiconductor device structures. More particularly, the present invention relates to a method for creating depressions in a semiconductor substrate or film using laser machining processes and using such depressions for defining precise electrical pathways in a semiconductor device structure.

2. Background of the Related Art

Connection lines (e.g., lead and/or bond connections), traces, signals and other elongated conductive elements are utilized in semiconductor device structures to carry electronic signals and other forms of electron flow between one region of the semiconductor device structure and another and between regions within the semiconductor device structure and external contacts (e.g., solder balls, bond pads and the like) associated therewith. Conventional methods for forming such elongated conductive elements utilize a damascene process wherein one or more depressions is etched in a semiconductor substrate or film, backfilled with an electrically conductive material and polished back or "planarized" even with the surface of the substrate or film. As used herein, the term "depression" includes troughs, channels, vias, holes and other depressions in and through a semiconductor substrate or film, which depressions may be used to define electrical pathways that carry electronic signals between one region of a semiconductor device structure and another, and between regions within the semiconductor device structure and external contacts associated therewith, as well as providing power, ground and bias to integrated circuitry of the semiconductor device structure. Such electrical pathways may include, without limitation, the depressions used to define traces or lines for signal lines, power and ground lines, and the like.

FIGS. 1A-1E schematically depict a conventional damascene process sequence for creating elongated conductive elements in the form of traces 26 in an interlevel dielectric layer 14. It will be understood by those of ordinary skill in the art that while the process depicted illustrates formation of a plurality of traces 26, the process sequence is typically utilized for the formation of other elongated conductive elements, e.g., lines for signal lines, power and ground lines, as well. It will be further understood that the methods and structures described herein do not form a complete process for manufacturing semiconductor device structures. The remainder of the process is known to those of ordinary skill in the art and, therefore, only the process steps and structures necessary to understand the conventional process sequence are described herein.

Referring to FIG. 1A, a cross-sectional view of a first intermediate structure 10 in the fabrication of a semiconductor device structure 24 having a plurality of traces 26 in the interlevel dielectric layer 14 thereof is illustrated. The first intermediate structure 10 includes an interlevel dielectric layer 14, e.g., thermally grown silicon dioxide ($SiO_2$), which resides on a semiconductor substrate 12, such as a silicon wafer. It should be understood by those of ordinary skill in the art that the figures presented in conjunction with this description are not meant to be actual cross-sectional views of any particular portion of an actual semiconductor device, but are merely idealized representations which are employed to more clearly and fully depict the conventional process sequence than would otherwise be possible. Elements common between the figures maintain the same numeric designation.

A photoresist layer 16, formed from a conventional photoresist material, is disposed atop the interlevel dielectric layer 14 and one or more trace precursors in the form of trace depressions 18 are patterned in the photoresist layer 16 using conventional photolithography techniques. The patterned trace depressions 18 may be of any shape or configuration including, but not limited to, circles, ovals, rectangles, elongated slots and the like.

As shown in FIG. 1B, the interlevel dielectric layer 14 is subsequently etched using the photoresist layer 16 as a mask so that the patterned trace depressions 18 are extended into the interlevel dielectric layer 14. Such etching processes are known to those of ordinary skill in the art and may include, without limitation, reactive ion etching (RIE) or an oxide etch. As shown in FIG. 1C, the photoresist layer 16 is subsequently removed by a conventional process, such as a wet-strip process, a tape lift-off technique, or combinations thereof, creating a second intermediate structure 20.

As shown in FIG. 1D, an electrically conductive material 22, e.g., tungsten, is subsequently blanket deposited over the interlevel dielectric layer 14 such that the trace depressions 18 are filled therewith. The electrically conductive material 22 is then planarized using, e.g., a mechanical abrasion technique, such as chemical mechanical planarization (CMP), to isolate the electrically conductive material 22 in the trace depressions 18, as illustrated in FIG. 1E. Thus, a semiconductor device structure 24 including a plurality of traces 26 in the interlevel dielectric layer 14 thereof is fabricated.

For more complex electrical pathways, for instance, those in which both an elongated conductive element (e.g., a trace) and one or more discrete conductive structures (e.g., vias) are to be defined in a single interlevel dielectric layer, a dual damascene process may be utilized. FIGS. 2A-2I illustrate a conventional dual damascene process sequence. Referring to FIG. 2A, a cross-sectional view of a first intermediate structure 10' in the fabrication of a semiconductor device structure 24' having a plurality of traces 26' and a plurality of conductor-filled vias 32 in the interlevel dielectric layer 14' thereof is illustrated. The first intermediate structure 10' includes an interlevel dielectric layer 14', e.g., thermally grown $SiO_2$, which resides on a semiconductor substrate 12', such as a silicon wafer. A mask layer 28 having a plurality of trace precursors in the form of trace depressions 18' patterned therein, is disposed atop the interlevel dielectric layer 14'. The patterned trace depressions 18' may be of any shape or configuration including, but not limited to, circles, ovals, rectangles, elongated slots and the like.

As shown in FIG. 2B, a photoresist layer 16', formed from a conventional photoresist material, is subsequently deposited atop the mask layer 28 such that the patterned trace depressions 18' are filled therewith. Next, as shown in FIG. 2C, conventional photolithography is performed on the photoresist layer 16', thereby forming a patterned photoresist layer 16" having a plurality of vias 30 patterned therein which align with the trace depressions 18' of the mask layer 28.

Referring to FIG. 2D, the interlevel dielectric layer 14' is subsequently etched, using, e.g., RIE, utilizing the patterned photoresist layer 16" as a mask. The pattern of vias 30 is accordingly extended into the upper portion of the interlevel dielectric layer 14'.

As shown in FIG. 2E, the patterned photoresist layer 16" is subsequently removed, forming a second intermediate structure 20'. Thereafter, the interlevel dielectric layer 14' is etched using the mask layer 28 with the patterned trace depressions 18' therein and the upper portion of the interlevel dielectric layer 14' with the vias 30 therein as a mask. This step is shown in FIG. 2F. As a result, the desired trace pattern is extended into the upper portion of the interlevel dielectric layer 14' and the vias 30 in the upper portion of the interlevel dielectric layer 14' are concurrently extended into the lower portion of the interlevel dielectric layer 14'.

Subsequently, as shown in FIG. 2G, the mask layer 28 is removed by a conventional process creating a third intermediate structure 34. An electrically conductive material 22', e.g., tungsten, is then blanket deposited over the interlevel dielectric layer 14' such that the trace depressions 18' and vias 30 are filled therewith, as shown in FIG. 2H. The electrically conductive material 22' is then planarized using, e.g., a mechanical abrasion technique such as chemical mechanical planarization (CMP), to isolate the electrically conductive material 22' in the vias 30 and trace depressions 18'. This step is illustrated in FIG. 2I. Thus, a semiconductor device structure 24' having a plurality of traces 26' and a plurality of conductor-filled vias 32 defined in a single interlevel dielectric layer 14' thereof is fabricated.

Further methods of forming damascene and dual damascene structures are known. For instance, U.S. Pat. No. 6,495,448 describes an additional process for forming a dual damascene structure. However, all such conventional methods include one or more photolithography processing steps which significantly impact the cost of manufacturing semiconductor device structures. Further, elongated conductive elements, such as traces, and discrete conductive structures, such as vias or bond pads, must be created during separate and distinct processing steps, again increasing the cost and complexity of manufacture. Still further, such techniques, while effective for forming elongated conductive elements and discrete conductive structures in the material for which the technique was designed, e.g., $SiO_2$, may not be as effective for creating such conductive elements or structures in other materials, such as semiconductor substrates (e.g., silicon wafers) or films (e.g., passivation films).

Accordingly, the inventor has recognized that a method of forming elongated conductive elements and discrete conductive structures in a semiconductor substrate or film that utilizes fewer process steps and less material than conventional processing techniques would be desirable. Further, the inventor has recognized that a method of forming elongated conductive elements and discrete conductive structures which is void of photoprocessing steps and which may be utilized to create multiple elongated conductive elements and discrete conductive structures substantially simultaneously would be advantageous.

Laser machining of interconnects for external contacts and of conductive vias is known in the art. For instance, in U.S. Pat. No. 6,107,109, a method for fabricating a straight line electrical path from a conductive layer within a semiconductor device to the backside of a semiconductor substrate using a laser beam is disclosed. The method includes forming an opening through a substrate to electrically connect external contacts engaged on a face side thereof to the backside of the substrate. The opening is perpendicular to both the face side and backside of the substrate. In one embodiment, the openings are formed using a laser machining process.

U.S. Pat. No. 6,114,240 discloses a method for laser machining conductive vias for interconnecting contacts (e.g., solder balls, bond pads and the like) on semiconductor components. In the described method, a laser beam is focused to produce vias having a desired geometry, e.g., hourglass, inwardly tapered, or outwardly tapered.

The inventor has recognized that a laser machine processing technique which may be used for the formation of elongated conductive elements, e.g., traces and the like, in semiconductor substrates or films would be advantageous. Further, a technique wherein multiple and different elongated conductive elements and discrete conductive structures may be defined in a single layer (e.g., a substrate or film) substantially simultaneously would be desirable.

BRIEF SUMMARY OF THE INVENTION

The present invention, in one embodiment, includes a method for creating depressions in a semiconductor substrate using laser machining processes and using such depressions to define precise electrical pathways in a semiconductor device structure. The method includes providing a semiconductor substrate (e.g., a silicon wafer) and forming one or more electrical pathways in the semiconductor substrate using laser machining processes. The electrical pathways may subsequently be filled with an electrically conductive material (e.g., a metal, a conductive polymer, or conductive nano-particles) and planarized to create one or more elongated conductive elements in the semiconductor substrate. It will be understood by those of ordinary skill in the art that if the semiconductor substrate is formed of a conductive semiconductor material such as silicon (e.g., a silicon substrate used for test purposes), an insulating layer comprising an insulating material, such as silicon dioxide ($SiO_2$), silicon nitride ($Si_3N_4$), or parylene, may be deposited or grown on the surface of the semiconductor substrate prior to filling the electrical pathways therein with the electrically conductive material.

The present invention, in another embodiment, further includes a method for creating depressions in a film residing on a semiconductor substrate, which depressions define precise electrical pathways in a semiconductor device structure. The film may include, for instance, a dielectric film in the form of an interlevel dielectric layer, a passivation film, or the like. The method includes providing a semiconductor substrate and forming a film over the semiconductor substrate. The method further includes forming one or more electrical pathways in the film using laser machining processes. The electrical pathways may subsequently be filled with an electrically conductive material (e.g., a metal, a conductive polymer, or conductive nano-particles) to create one or more elongated conductive elements in the film. It will be understood by those of ordinary skill in the art that ablated electrical pathways may extend into the film a depth less than the full thickness of the film. Alternatively, the ablated electrical pathways may extend through the full thickness of the film such that the semiconductor substrate, including any active areas thereon, may be contacted. As a further option, the electrical pathways may be extended into and even through the semiconductor substrate.

The present invention, in a further embodiment, includes a method for creating one or more elongated conductive elements and one or more discrete conductive structures substantially simultaneously in a single semiconductor substrate or film layer. As used herein, "substantially simultaneously" is used to indicate a rapid traversal of a laser beam over the surface of the substrate or film, as more fully described below. The method includes providing a semiconductor substrate, optionally providing a film layer over the semiconductor substrate, and substantially simultaneously forming locations and configurations for one or more elongated conductive elements and one or more discrete conductive structures in the substrate or film using laser machining processes. The resulting depressions defining the elongated conductive element(s) and discrete conductive structure(s) may subsequently be filled with an electrically conductive material (e.g., a metal, a conductive polymer, or conductive nano-particles). It will be understood by those of ordinary skill in the art that the method of the present invention may be used to ablate one or more elongated conductive elements and one or more discrete conductive structures in association with one another. Alternatively, the method may be used to substantially simultaneously form separate discrete conductive structures and elongated conductive elements, depending on the desired application.

In yet another embodiment, the present invention includes a method for creating electrical connections through a sidewall of a semiconductor device structure using laser machining processes. The electrical connections may include traces or lines for signal lines, power and ground lines, and the like, to provide access to power, signal and ground sources external to the semiconductor device structure. The method includes providing a semiconductor substrate, optionally forming a film layer over the semiconductor substrate and forming one or more electrical connections through a sidewall of the semiconductor substrate or film using laser machining processes. The electrical connection(s) may subsequently be filled with an electrically conductive material, e.g., a metal, a conductive polymer, or conductive nano-particles. Such method may be useful, for instance, in forming a die connect for a vertical surface mount package.

Additional aspects of the invention, together with the advantages and novel features appurtenant thereto, will be set forth in the description which follows and will also become readily apparent to those of ordinary skill in the art upon examination of the following and from the practice of the invention.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

The present invention is directed to a method for creating depressions in a semiconductor substrate or film using laser machining, or ablation, processes. The depressions define traces or lines for signal lines, power and ground lines, and other elongated conductive elements utilized for defining electrical pathways in a semiconductor device. The method requires fewer processing steps than conventional mask and etch techniques and enables the creation of lines or traces substantially simultaneously with discrete conductive structures, such as vias or bond pads. Further, the process offers a lower cost alternative to conventional damascene and dual damascene processes and enables the formation of elongated conductive elements and discrete conductive structures of varying shapes to maximize use of the substrate or film. An exemplary application of the technology of the present invention is for creating electrical pathways to form a redistribution layer in wafer level packaging. The particular embodiments described herein are intended in all respects to be illustrative rather than restrictive. Other and further embodiments will become apparent to those of ordinary skill in the art to which the present invention pertains without departing from its scope.

FIGS. 3A-3E, 4A-4E, 5A-5E and 6A-6E illustrate various views of techniques according to the present invention for forming depressions in a semiconductor substrate (FIGS. 3A-3E and 5A-5E) or film (FIGS. 4A-4E and 6A-6E), which depressions define traces or lines for signal lines, power and ground lines, and other elongated conductive elements in semiconductor device structures. It should be understood and appreciated that the methods and structures described herein do not form a complete process for manufacturing semiconductor device structures. The remainder of the process is known to those of ordinary skill in the art and, therefore, only the process steps and structures necessary to understand the method of the present invention are described herein.

Referring to FIGS. 3A-3E, steps in an exemplary method according to the present invention for fabricating a semiconductor device structure 100 having a plurality of elongated conductive elements in the form of traces 102 in the semiconductor substrate 104 thereof are illustrated. It will be understood and appreciated by those of ordinary skill in the art that while the process depicted illustrates formation of a plurality of traces 102, the process sequence illustrated may also be utilized for the formation of other elongated conductive elements as well.

Figure 1A:
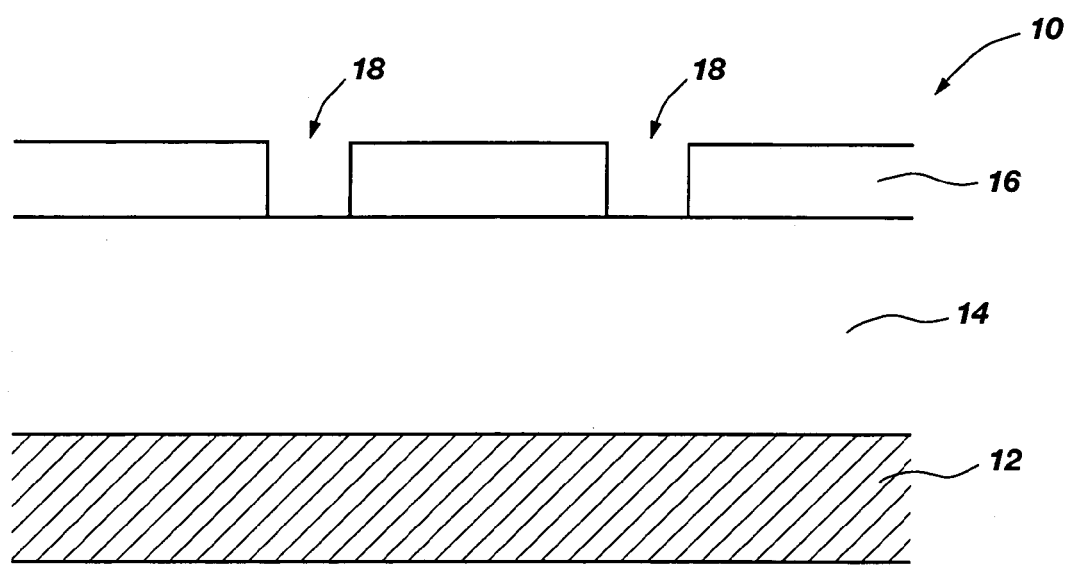
FIGS. 1A-1E are side cross-sectional views schematically illustrating a prior art method of forming a damascene structure.
Figure 1B:
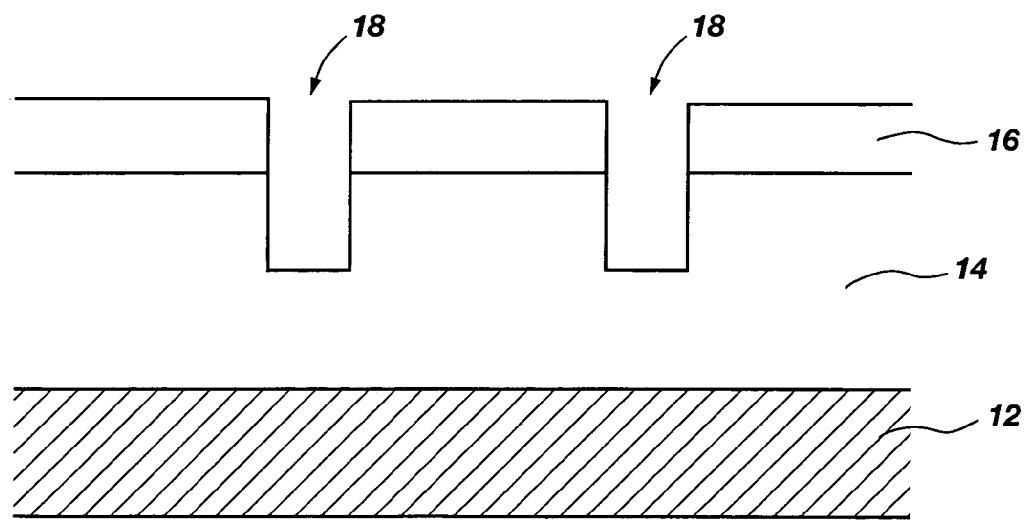
Figure 1C:
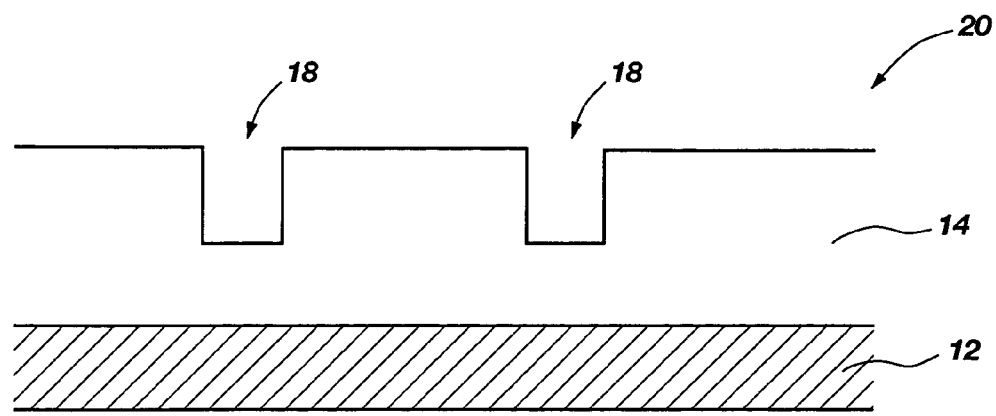
Figure 1D:
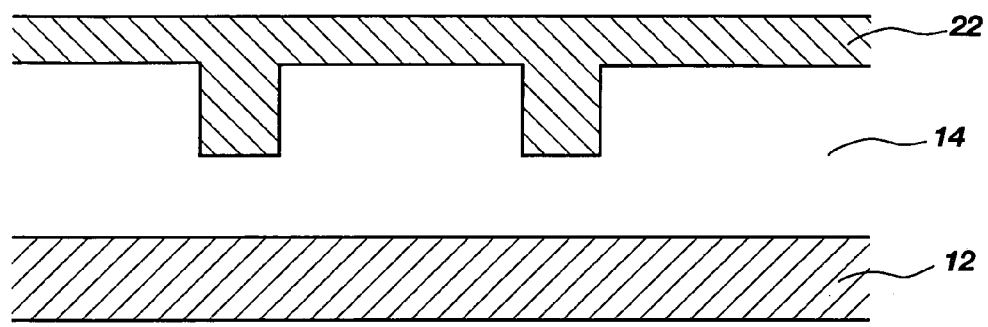
Figure 1E:
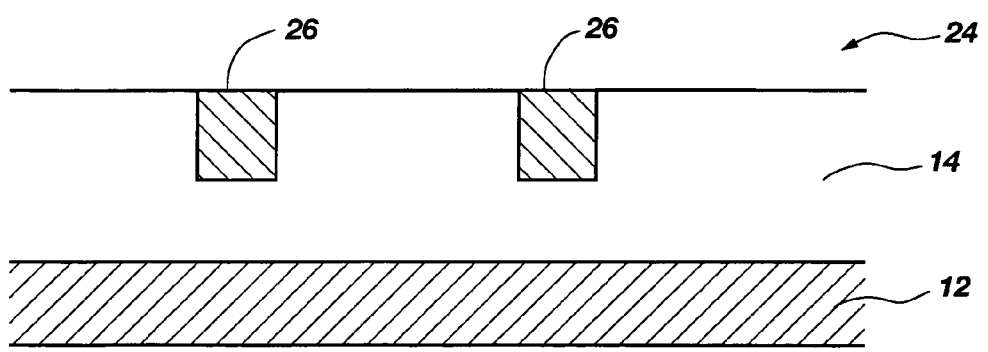
Figure 2A:
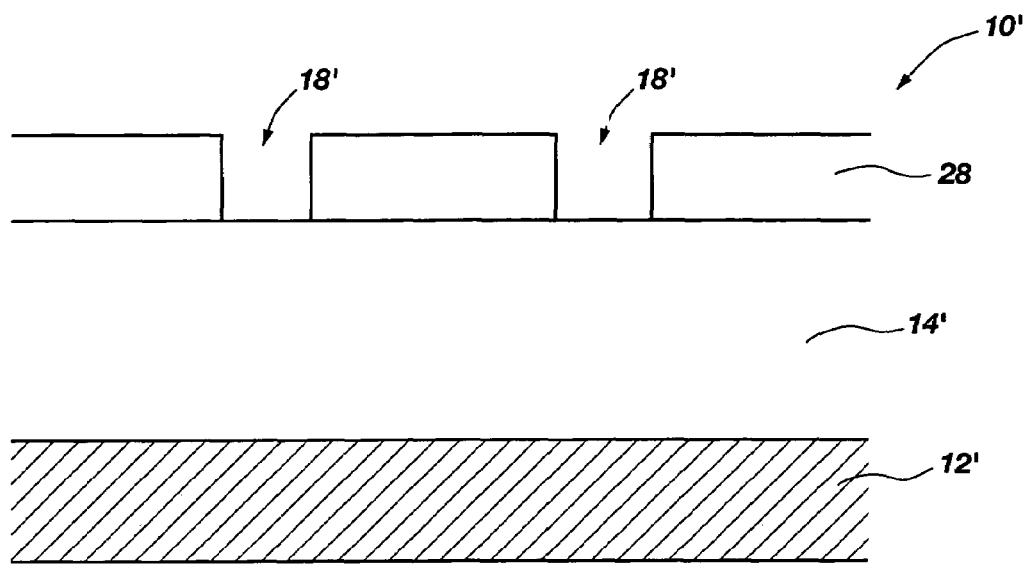
FIGS. 2A-2I are side cross-sectional views schematically illustrating a prior art method of forming a dual damascene structure.
Figure 2B:
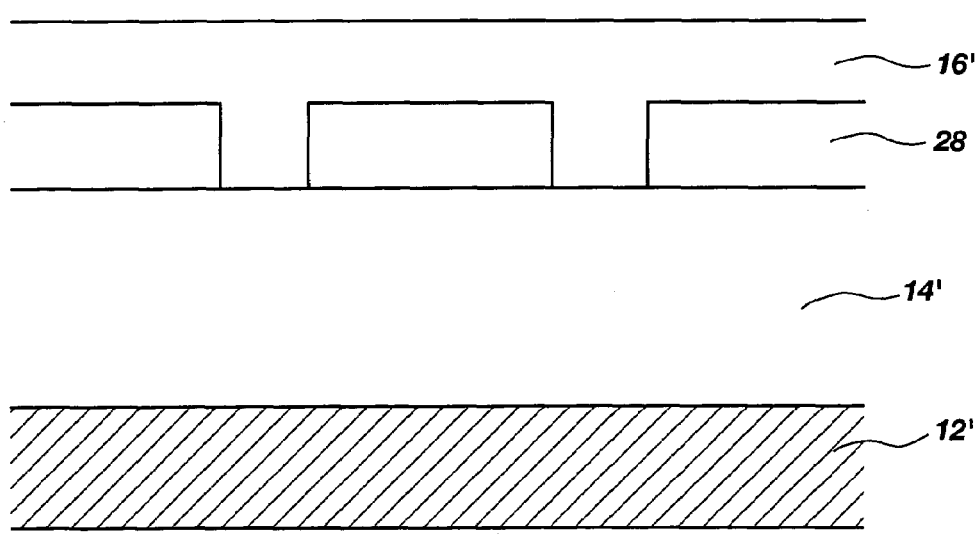
Figure 2C:
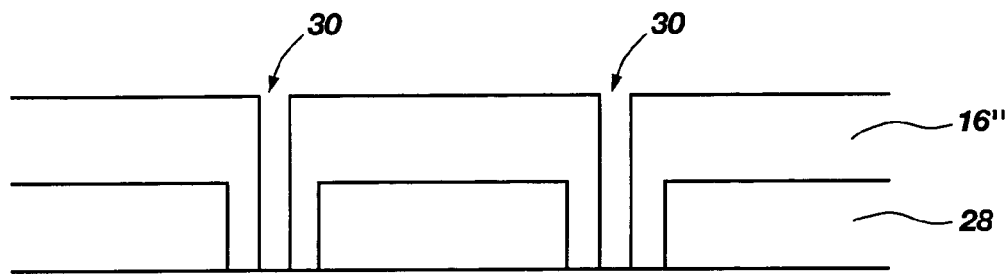
Figure 2C:
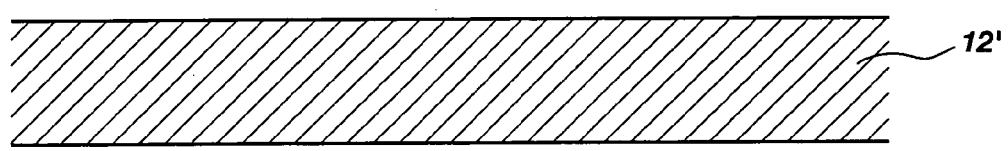
Figure 2D:
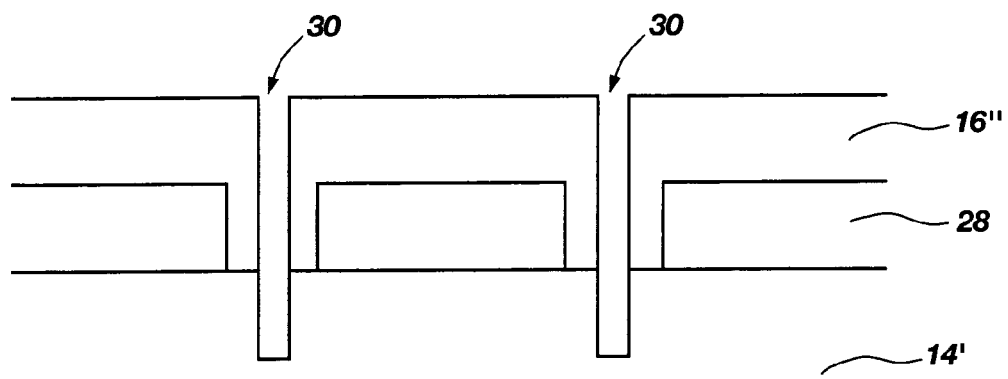
Figure 2D:
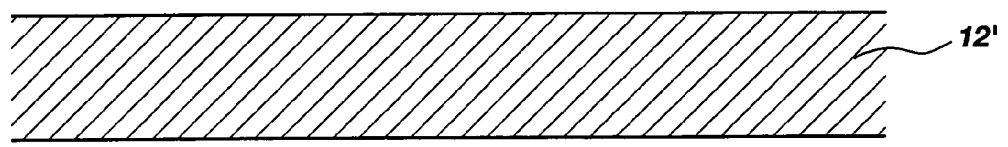
Figure 2E:
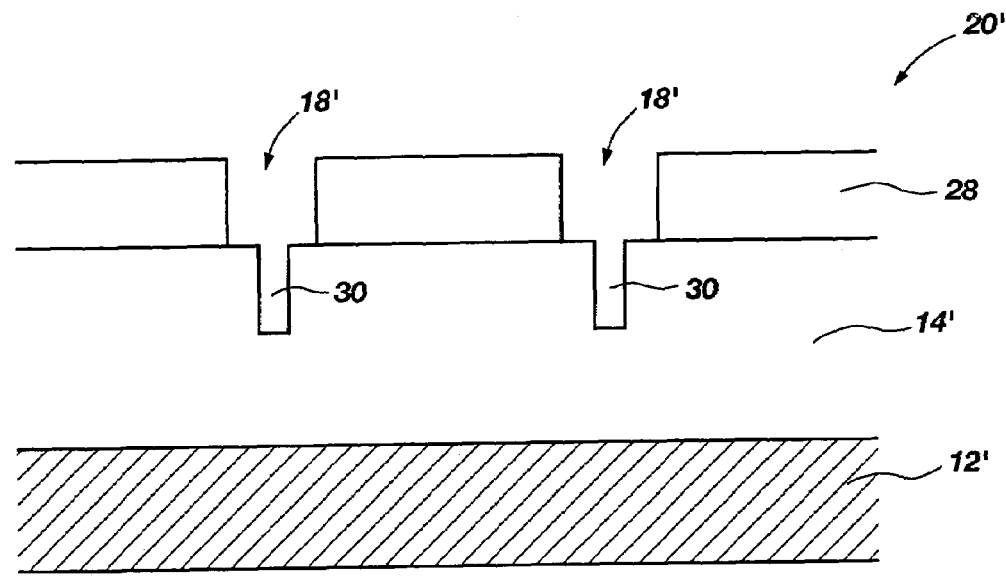
Figure 2F:
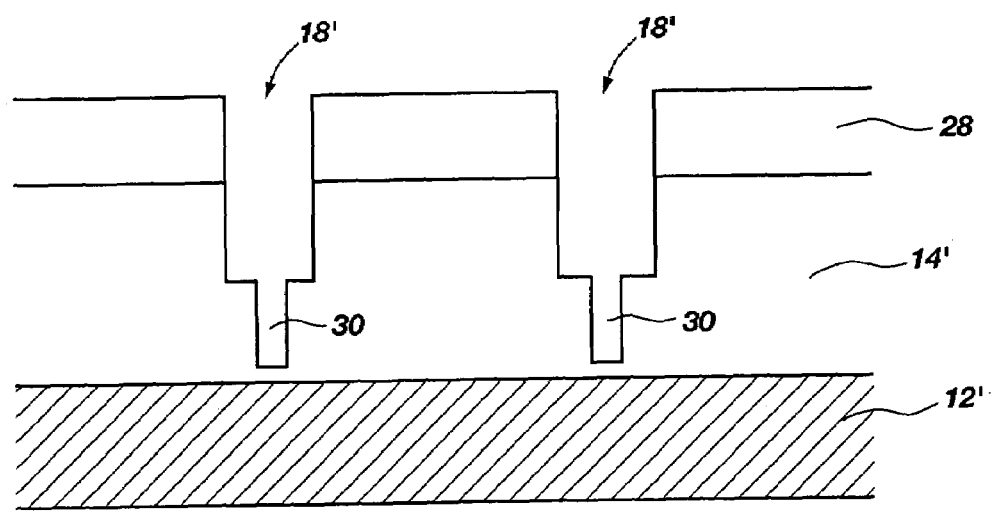
Figure 2G:
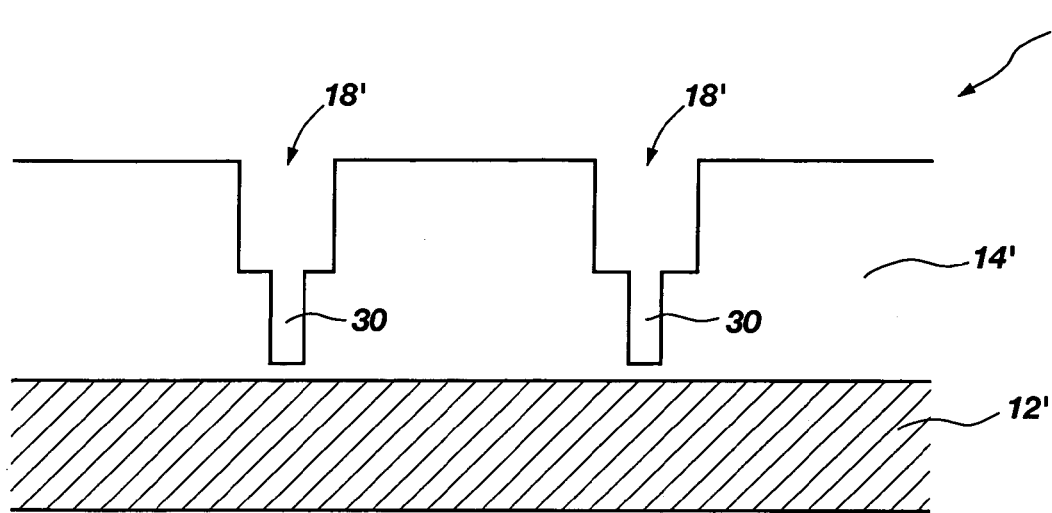
Figure 2H:
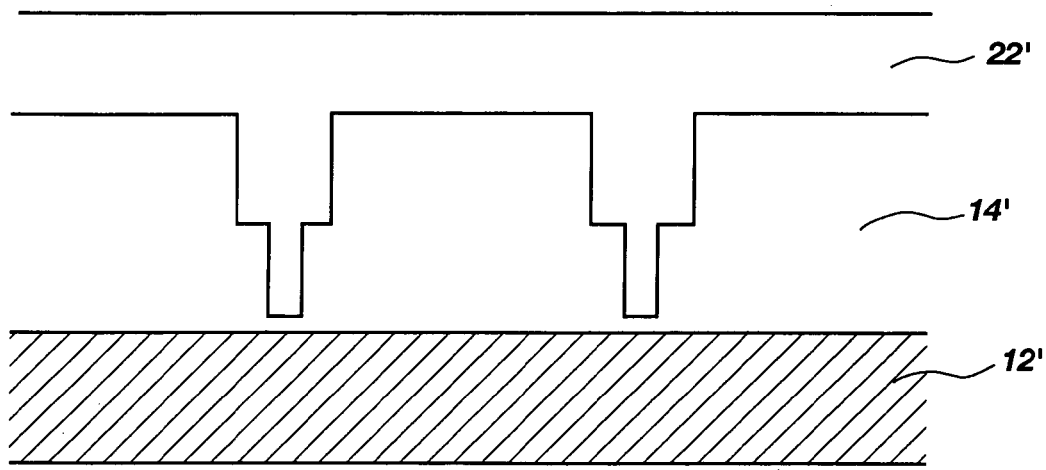
Figure 2I:
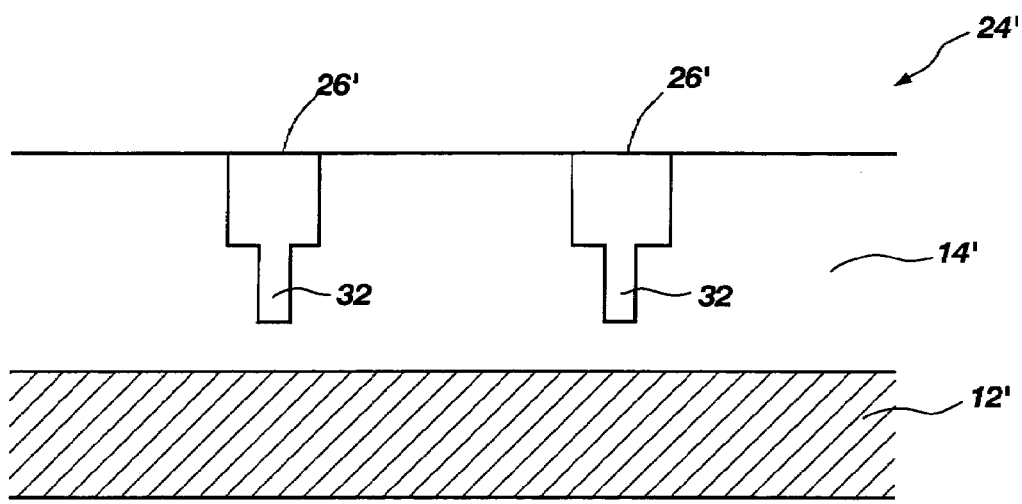
Figure 3A:
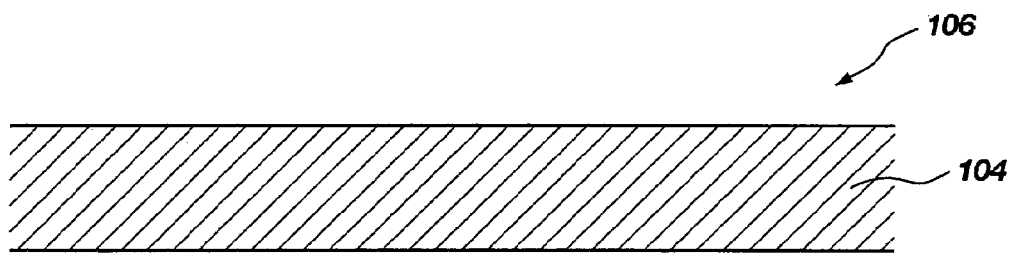
FIGS. 3A-3E are side cross-sectional views schematically illustrating a method in accordance with the present invention for forming elongated conductive elements (e.g., traces) in a semiconductor substrate (e.g., a silicon wafer)

With initial reference to FIG. 3A, a cross-sectional view of an intermediate structure 106 in the fabrication of a semiconductor device structure 100 having a plurality of traces 102 formed in the semiconductor substrate 104 thereof is illustrated. As used herein, the term "semiconductor substrate" includes a semiconductor wafer or other substrate comprising a layer of semiconductor material, such as a silicon wafer, a silicon on insulator ("SOI") substrate, a silicon on sapphire ("SOS") substrate, an epitaxial layer of silicon on a base semiconductor foundation, and other semiconductor materials including, but not limited to, silicon-germanium, germanium, gallium arsenide and indium phosphide.

It should be understood that the figures presented in conjunction with this description are not meant to be actual cross-sectional views of any particular portion of an actual semiconductor device, but are merely idealized representations which are employed to more clearly and fully depict the process of the invention than would otherwise be possible. Elements common between the figures maintain the same numeric designation.

Figure 3B:
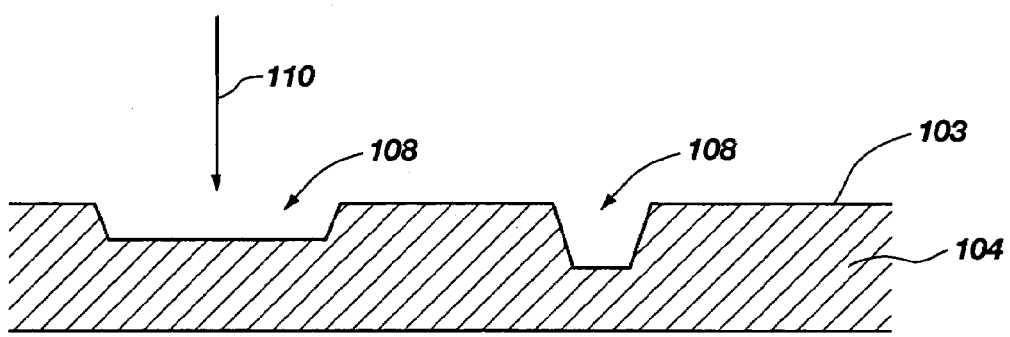

Referring now to FIG. 3B, a desired pattern of one or more trace precursors in the form of trace depressions 108 may be formed in a surface 103 of the semiconductor substrate 104 using a focused laser beam 110. In practice, one would place a semiconductor wafer, or other suitable semiconductor substrate 104, on a platen of a suitable laser machining apparatus. The desired pattern of trace depressions 108 may be stored in a software program associated with the laser machining apparatus such that upon activation of the laser machining apparatus, the desired pattern may be ablated in the surface of the semiconductor substrate 104. In doing so, the focused laser beam 110 rapidly traverses the surface 103 of the semiconductor substrate 104, pausing briefly in those locations where a trace depression 108 is desired. Due to the rapidity of the process, the method of the present invention would typically be carried out at the wafer level.

Currently available lasers in semiconductor device manufacturing plants have a minimum focused laser beam 110 width or footprint of approximately 15 microns, or smaller. Accordingly, the technology of the present invention enables the formation of trace depressions 108 having a width as small as approximately 15 microns, or smaller, and a shape suitable to define the desired trace pattern. A suitable laser machining apparatus for forming the trace depressions 108 is Model No. 2700 manufactured by Electro Scientific, Inc., of Portland, Oreg. Another suitable laser machining apparatus is manufactured by General Scanning of Somerville, Mass. and is designated as Model No. 670-W. Yet another suitable laser machining apparatus for forming the trace depressions 108 is manufactured by Synova S.A., Lausanne, Switzerland.

A representative laser fluence for forming the trace depressions 108 through a semiconductor substrate 104 (e.g., a silicon wafer) having a thickness of about 28 mils (725 µm), is from about 2 to about 10 watts per opening at a pulse duration of 20-25 NS, and at a repetition rate of up to several thousand per second. The wavelength of the focused laser beam 110 may be a standard UV wavelength (e.g., 355 nm) or green wavelength (e.g., 1064 nm-532 nm). By way of example, the width of the trace depressions 108 can be from about 10 µm to about 2 mils or greater.

It will be understood and appreciated by those of ordinary skill in the art that the footprint of the focused laser beam 110 is limited only by the available optics. Thus, as optical technology advances, the footprint of the focused laser beam 110 will become reduced in dimension, such that trace depressions 108 having increasingly smaller widths may be formed utilizing the technology of the present invention.

The laser machining process of the present invention results in the formation of trace depressions 108 which taper inward as the depth of the semiconductor substrate 104 increases. The trace depressions 108 may extend into the semiconductor substrate 104 a distance less than the thickness of the semiconductor substrate 104 as shown, or may extend through the full thickness of the semiconductor substrate 104 (embodiment not shown). Additionally, each trace depression 108 may extend the same distance into the semiconductor substrate 104 (embodiment not shown) or may extend into the semiconductor substrate 104 by varying distances as shown.

Figure 3C:
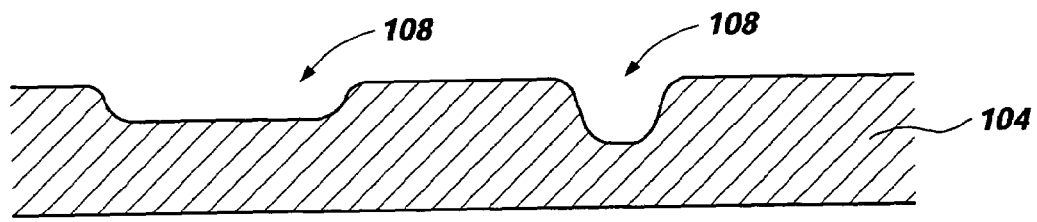

Subsequently, as shown in FIG. 3C, the semiconductor substrate 104 may be etched to clean up the trace depressions 108 and smooth the cross-sectional shape thereof. Etching in this manner may remove slag created by the laser machining process as well as accent the desired shape(s) of the trace depressions 108. Conventional wet etch or dry etch techniques may be employed. In contrast with wet etch techniques, techniques involving dry etch, including, without limitation, glow-discharge sputtering, ion milling, reactive ion etching (RIE), reactive ion beam etching (RIBE), plasma etching, point plasma etching, magnetic ion etching, magnetically enhanced reactive ion etching, plasma enhanced reactive ion etching, electron cyclotron resonance and high-density plasma etching, are capable of etching in a substantially anisotropic fashion. This means that the target area of a substrate is etched primarily in a substantially transverse or perpendicular direction relative to the plane of the surface of the semiconductor substrate 104. Thus, such dry etch techniques are capable of defining structures with substantially vertical sidewalls. Due to a trend in semiconductor fabrication processes toward decreased dimensions of structures on semiconductor devices, dry etching is often desirable for defining structures upon semiconductor device substrates.

Figure 3D:
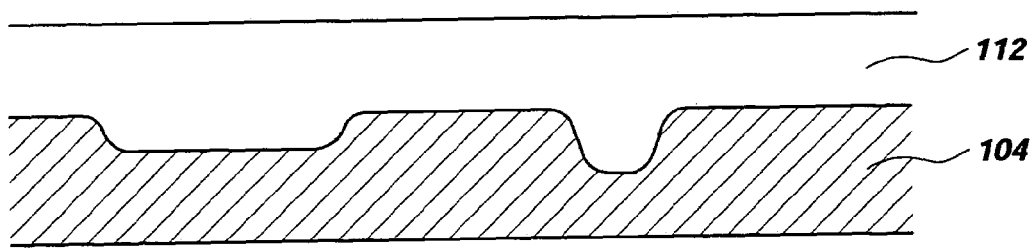

An electrically conductive material 112 may subsequently be blanket coated over the etched semiconductor substrate 104 using a suitable deposition process such that the trace depressions 108 are filled therewith. This step is shown in FIG. 3D. Suitable deposition processes include, by way of example and not limitation, plating, solder, atomized nanoparticle deposition, CVD, PECVD, sputtering, and the like. The electrically conductive material 112 may comprise a metal including, without limitation, solder, aluminum, titanium, nickel, iridium, copper, gold, tungsten, silver, platinum, palladium, tantalum, molybdenum, or alloys of these metals. Alternatively, the electrically conductive material 112 may comprise a conductive polymer, such as a metal-filled silicone, or an isotropically conductive or conductor-filled epoxy. Suitable conductive polymers are sold, for instance, by Epoxy Technology of Billerica, Mass. One example is its conductive polymer designated E3114-5. Further suitable conductive polymers include, without limitation, those sold by A.I. Technology of Trenton, N.J.; Sheldahl of Northfield, Minn.; and 3M of St. Paul, Minn. A conductive polymer may be deposited in the trace depressions 108 as a viscous material and subsequently cured as required and may be applied by a dispensing nozzle or squeegee, by spin-coating, or otherwise as known to those of ordinary skill in the art. In a further embodiment, the electrically conductive material 112 may comprise conductive nano-particles.

Although not shown in FIGS. 3A-3E, if traces 102, or other elongated conductive structures, are formed in a semiconductor substrate 104 comprising a conductive semiconductor material, such as silicon, an insulating layer comprising an insulating material (such as silicon dioxide ($SiO_2$), silicon nitride ($Si_3N_4$), or parylene) may optionally be deposited or grown over the surface of the semiconductor substrate 104 prior to filling electrical pathways formed therein with the electrically conductive material 112.

Figure 3E:
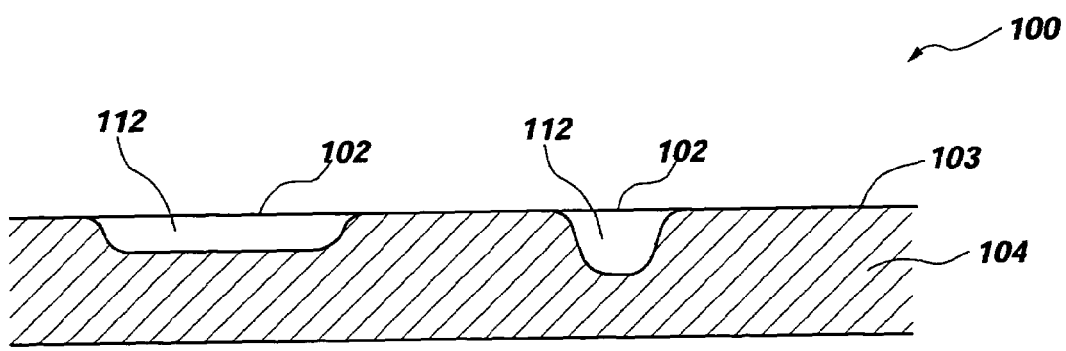

Next, as shown in FIG. 3E, the electrically conductive material 112 may be planarized using, e.g., a mechanical abrasion technique, such as chemical mechanical planarization (CMP), to laterally isolate the electrically conductive material 112 in the trace depressions 108.

Figure 3F:
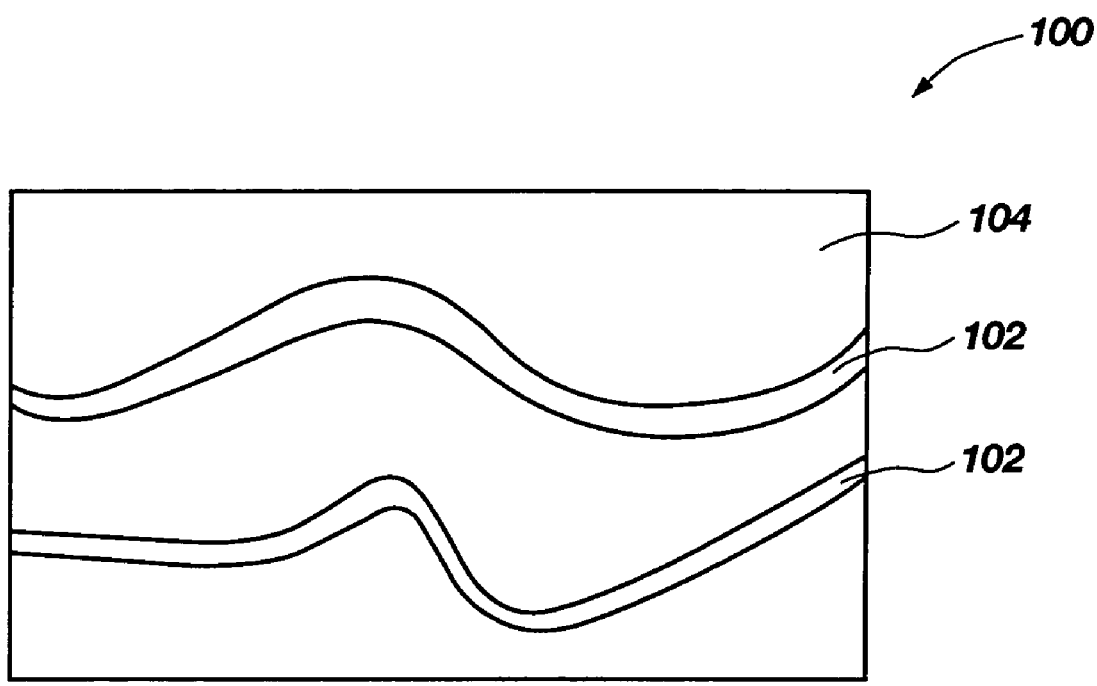
FIG. 3F is a top plan view of a semiconductor device having a plurality of filled elongated conductive elements in a semiconductor substrate thereof.

The above-described method results in a semiconductor device structure 100 which includes a plurality of traces 102 in the semiconductor substrate 104 thereof (see, FIG. 3F). The method requires fewer processing steps than conventional mask and etch techniques and, in part because there are no photolithography steps involved, the method offers a lower cost alternative to conventional damascene processes. Further, the method of the present invention enables the formation of elongated conductive elements of varying shapes, sizes and depths to maximize the use of the substrate. Still further, the above-described method provides a simple process for altering a desired electrical pattern, prior to ablation, as a new pattern merely must be programmed into the laser machining apparatus. That is, no new masks are required making the process easier and more convenient than conventional mask and etch techniques.

A similar process sequence to that shown in FIGS. 3A-3E may be utilized to ablate one or more conductive elements in a semiconductor film such as an interlevel dielectric layer 114. Referring to FIGS. 4A-4E, steps in an exemplary method according to the present invention for fabricating a semiconductor device structure 100' having a plurality of elongated conductive elements in the form of traces 102' in the interlevel dielectric layer 114 thereof are illustrated. It will be understood and appreciated by those of ordinary skill in the art that while in the illustrated process the traces 102' are formed in an interlevel dielectric layer 114, a similar process may also be utilized to form elongated conductive elements in other films, such as a passivation film (e.g., a silicon dioxide ($SiO_2$), silicon nitride ($Si_3N_4$), or parylene film). The laser ablation method of the present invention enables electrical pathways to be formed in any such desirable material and all such variations are contemplated to be within the scope hereof.

Figure 4A:
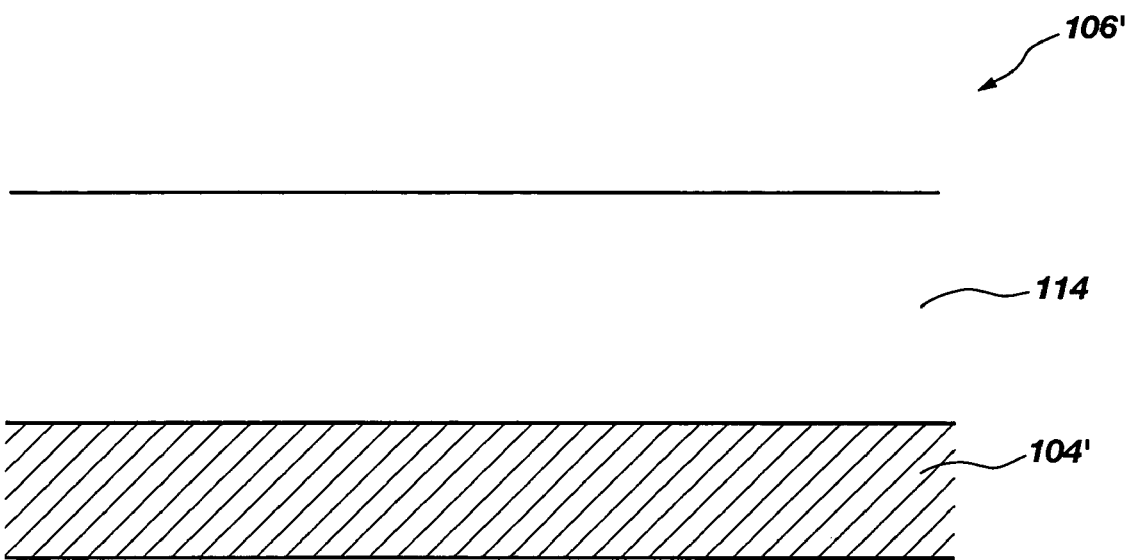
FIGS. 4A-4E are side cross-sectional views schematically illustrating a method in accordance with the present invention for forming elongated conductive elements in an interlevel dielectric layer.

Referring to FIG. 4A, a cross-sectional view of an intermediate structure 106' in the fabrication of a semiconductor device structure 100' having a plurality of traces 102' formed in the interlevel dielectric layer 114 thereof is illustrated. The interlevel dielectric layer 114 resides on a semiconductor substrate 104'. By way of example and not limitation, the interlevel dielectric layer 114 may be deposited on the semiconductor substrate 104' using, for example, chemical vapor deposition (CVD) techniques (such as plasma-enhanced chemical vapor deposition (PECVD)) or physical vapor deposition (PVD) techniques (such as sputtering). The interlevel dielectric layer 114 may be formed of an inorganic or organic material having a low dielectric constant, such as an oxide compound (e.g., $SiO_2$), an aerogel, or a polymer.

Figure 4B:
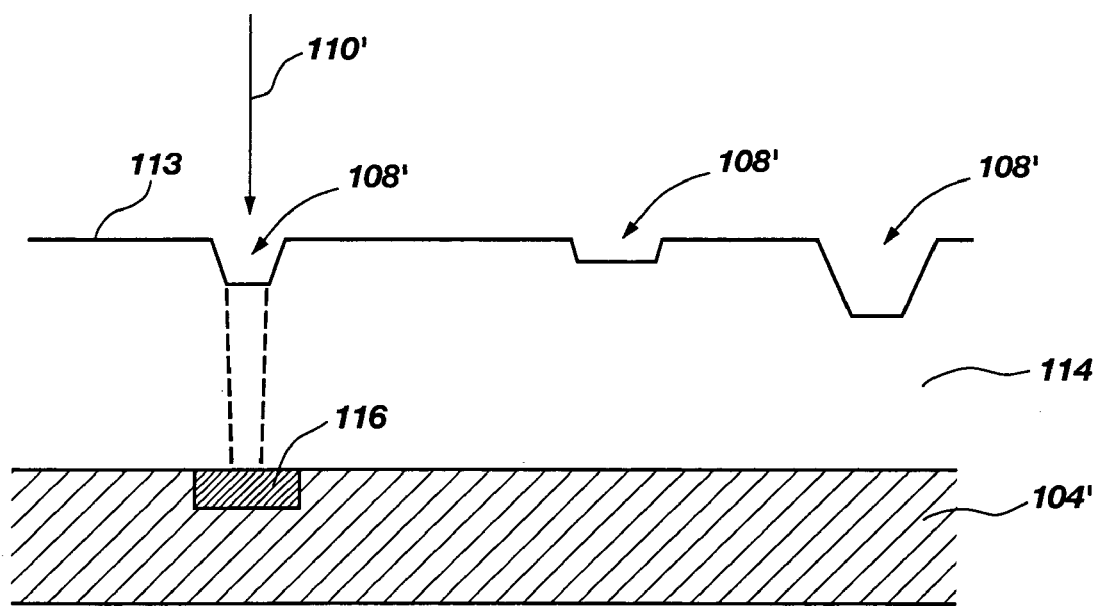

Referring now to FIG. 4B, a desired pattern of one or more trace precursors in the form of trace depressions 108' may be formed in a surface 113 of the interlevel dielectric layer 114 using a focused laser beam 110'. A representative laser fluence for forming the trace depressions 108' through an interlevel dielectric layer 114 is from about 2 to about 10 watts/opening at a pulse duration of 20-25 NS, and at a repetition rate of up to several thousand per second. The wavelength of the focused laser beam 110' may be a standard UV wavelength (e.g., 355 nm) or infrared or green wavelength (e.g., 1064 nm-532 nm). By way of example, the width of the trace depressions 108' can be from about 10 μm to about 2 mils or greater.

Similar to the embodiment in which trace depressions 108 are ablated into a semiconductor substrate 104, the laser machining process of the present invention results in the formation of trace depressions 108' which taper inward as the depth of the interlevel dielectric layer 114 increases. The trace depressions 108' may extend through the full thickness of the interlevel dielectric layer 114 such that the semiconductor substrate 104', including any active areas 116 thereon, may be contacted through the trace depressions 108', as shown in broken lines in FIG. 4B. Alternatively, and as shown in solid lines in FIGS. 4B-4E, the trace depressions 108' may extend into the interlevel dielectric layer 114 a distance less than the thickness of the interlevel dielectric layer 114. Each trace depression 108' may extend the same distance into the interlevel dielectric layer 114 or the trace depressions 108' may extend into the interlevel dielectric layer 114 by varying distances as shown. As a further option, the trace depressions 108' may be extended into and even through the semiconductor substrate 104' (embodiment not shown).

Figure 4C:
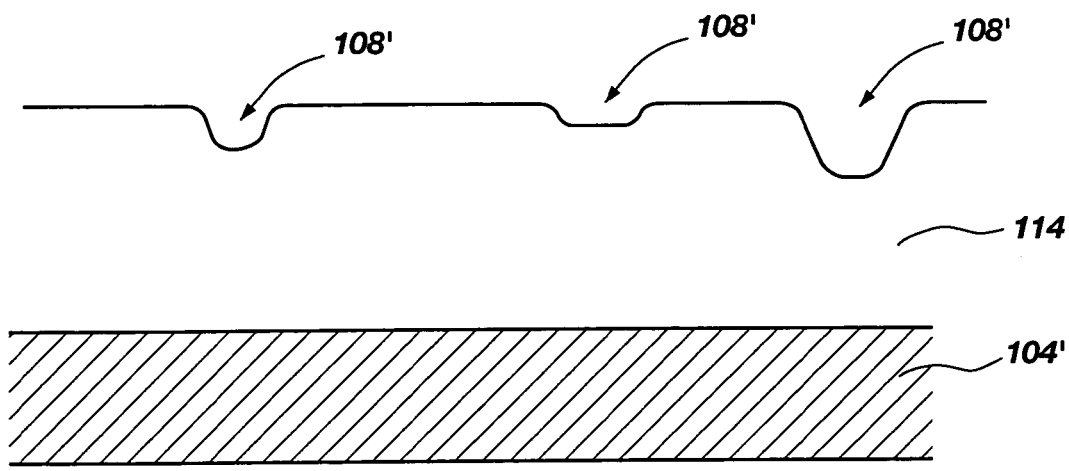

Subsequently, as shown in FIG. 4C, the interlevel dielectric layer 114 may be etched to clean up the trace depressions 108' and smooth the cross-sectional shape thereof using conventional wet or dry etch techniques.

Figure 4D:
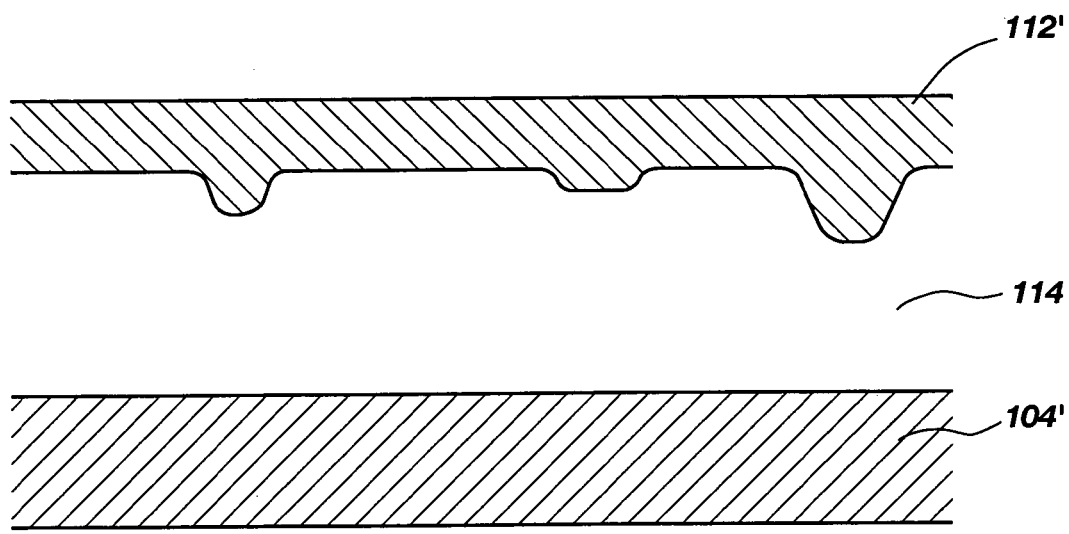

An electrically conductive material 112' may subsequently be blanket coated over the etched interlevel dielectric layer 114 using a suitable deposition process such that the trace depressions 108' are filled therewith. This step is shown in FIG. 4D.

Figure 4E:
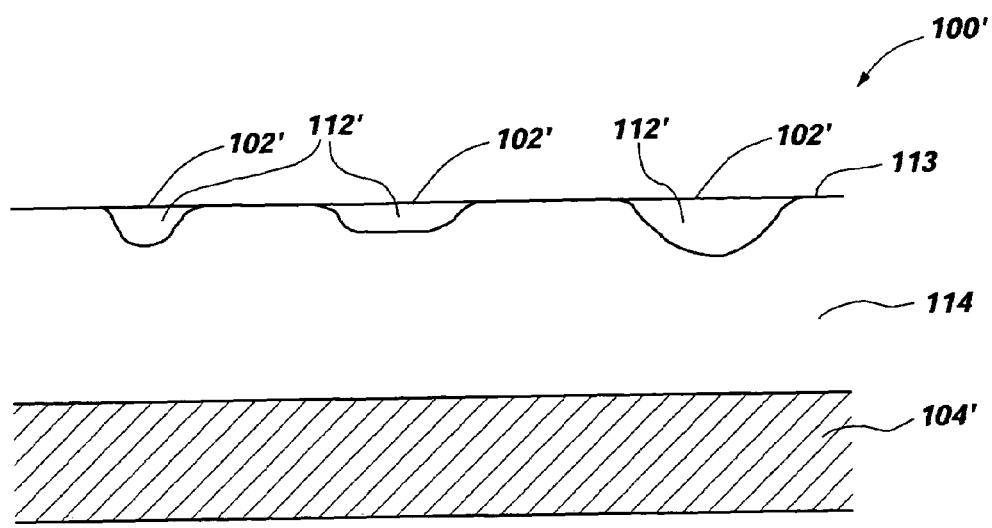

Next, as shown in FIG. 4E, the electrically conductive material 112' may be planarized using, e.g., a mechanical abrasion technique, such as chemical mechanical planarization (CMP), to laterally isolate the electrically conductive material 112' in the trace depressions 108'.

Figure 4F:
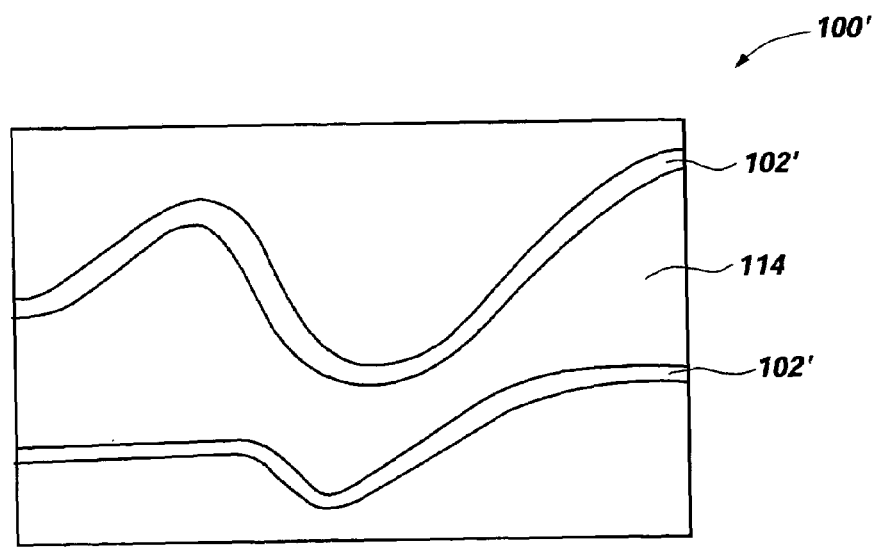
FIG. 4F is a top plan view of a semiconductor device having a plurality of filled elongated conductive elements in an interlevel dielectric layer thereof.

The above-described method results in a semiconductor device structure 100' which includes a plurality of traces 102' in the interlevel dielectric layer 114 thereof (see, FIG. 4F).

As previously stated, trace depressions 108' having a width as small as approximately 15 microns, or smaller, and a shape suitable to define the desired trace pattern, may be formed using currently available optics and the technology of the present invention. This offers a significant advantage over conventional mask and etch techniques, as utilizing such prior art processes, the smallest signal line traces that may be formed have a footprint or width of approximately 32 microns. Similarly, the smallest power and ground traces that may be formed utilizing conventional mask and etch processes have an approximately 80 micron footprint or width, the smallest lead connection dimensions are approximately 60 microns and the smallest bond dimensions are approximately 30 microns. As dimensions of semiconductor devices continue to decrease, the technology of the present invention will enable a concurrent decrease in the footprint of conductive structures on such devices.

Figure 7:
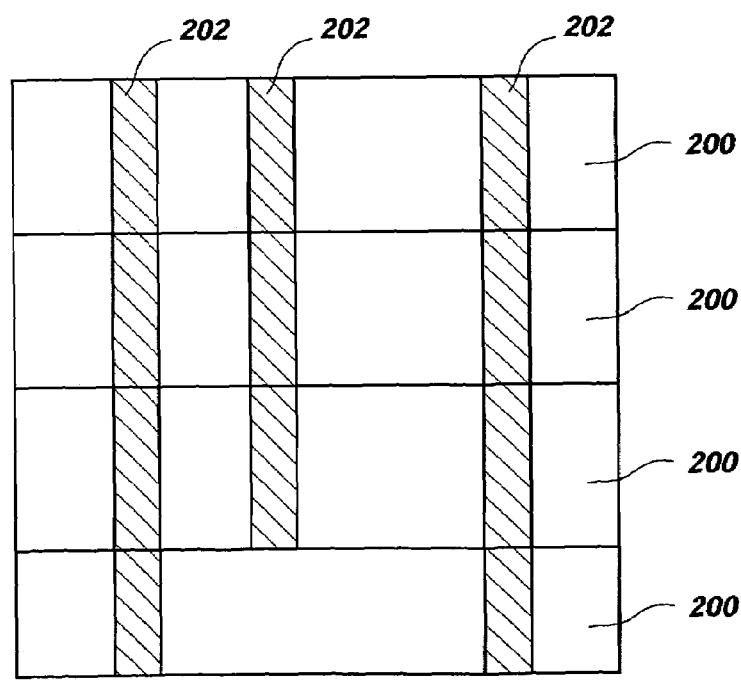
FIG. 7 is a side view of a semiconductor device, e.g., a cellular telephone/Personal Digital Assistant (PDA) combination unit, which includes a plurality of stacked chips, such device having precise vertical electrical connections formed through the thickness of multiple chips in the stack.

Additionally, there is a growing trend toward semiconductor devices, for instance, cellular telephone/Personal Digital Assistant (PDA) combination units, which include a plurality of stacked chips 200 (see FIG. 7). Using current technology for forming vertical electrical connections between stacked chips, such devices may have a full thickness of approximately 150 microns. However, using the technology of the present invention, precise vertical electrical pathways 202 may be provided which will enable stacked units having a thickness of up to 750 microns or more. In forming such stacked chip devices, each chip 200 may be separately fabricated and a plurality of fabricated chips 200 may be assembled into a stack of the desired thickness. Subsequently, one or more depressions defining precise electrical pathways 202 may be ablated through one or more of the stacked chips 200. The depressions may then be filled with the desired conductive material and planarized, as previously described.

Figure 8:
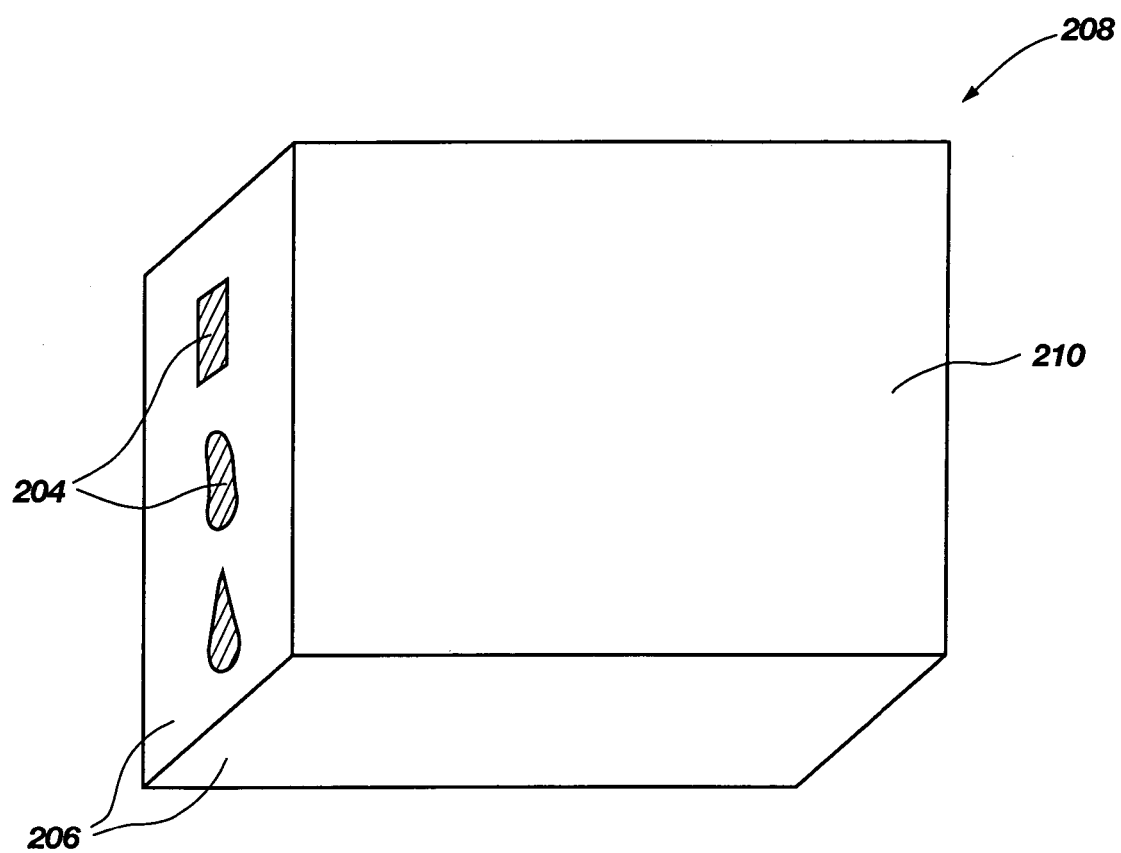
FIG. 8 is a perspective view of a semiconductor device structure having an electrical connection formed directly through a sidewall thereof.

Due to the small footprint of the laser beam and the precision with which electrical pathways may be formed using the technology of the present invention, electrical connections 204 may be formed through the sidewalls 206 of a semiconductor device structure 208 as shown in FIG. 8. This is in contrast to conventional mask and etch techniques wherein electrical pathways may be formed only through the top surface 210 and bottom surface (not shown) of the semiconductor device structure 208. The ability to form electrical connections through the sidewalls 206 of the semiconductor device structure 208 offers a significantly greater array of options when forming electrical pathways than is offered using conventional techniques. Such method may be useful, for instance, in forming a die connect for a vertical surface mount package.

The method of the present invention may also be utilized for creating electrical pathways in a semiconductor device structure, which pathways include an elongated conductive element, such as a trace, in combination with one or more discrete conductive structures, e.g., vias or bond pads, in a single layer (e.g., a semiconductor substrate or interlevel dielectric layer) thereof. FIGS. 5A-5E and 6A-6E illustrate this exemplary embodiment of the present invention. It will be understood by those of ordinary skill in the art that this method of the present invention may be used to ablate one or more elongated conductive elements and one or more discrete conductive structures in association with or connected to one another. Alternatively, the method may be used to substantially simultaneously form separate discrete conductive structures and elongated conductive elements, depending on the desired application. As used herein, the terms "substantially simultaneously" and "concurrently" are interchangeable and are used to indicate a rapid traversal of the laser beam over the surface of the desired substrate or film.

Figure 5A:
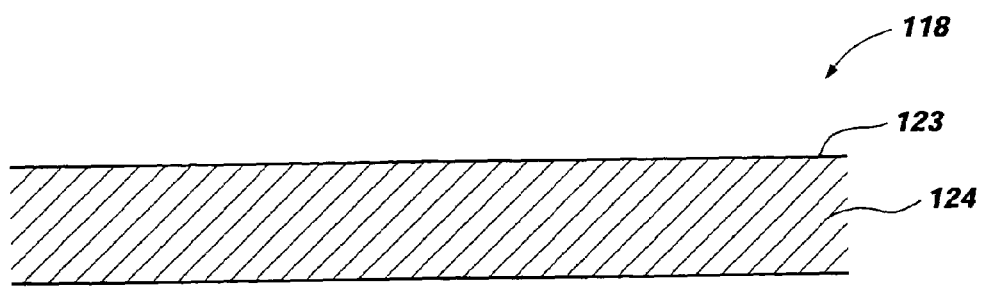
FIGS. 5A-5E are side cross-sectional views schematically illustrating a method (in accordance with the present invention) for forming elongated conductive elements (e.g., traces) in a semiconductor substrate concurrently with the formation of a discrete conductive structure, e.g., a conductive via.
Figure 5B:
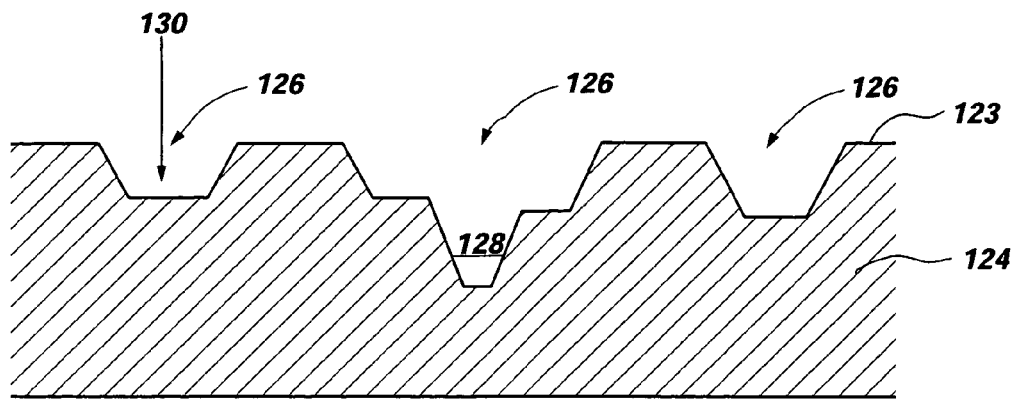

Referring initially to FIG. 5A, a cross-sectional view of an intermediate structure 118 in the fabrication of a semiconductor device structure 120 having a plurality of traces 122 formed in a surface 123 of the semiconductor substrate 124 thereof is shown. As shown in FIG. 5B, a desired pattern of elongated conductive element precursors in the form of one or more trace depressions 126 and one or more discrete conductive structure precursors, e.g., vias 128, may be formed in the surface 123 of the semiconductor substrate 124 using a focused laser beam. The trace depressions 126 and vias 128 may be of any size, shape and depth suitable to define the desired conductive pathway. The vias 128 may extend through the full thickness of the semiconductor substrate 124 (embodiment not shown), or may extend into the semiconductor substrate 124 a depth less than the full thickness thereof as shown.

Figure 5C:
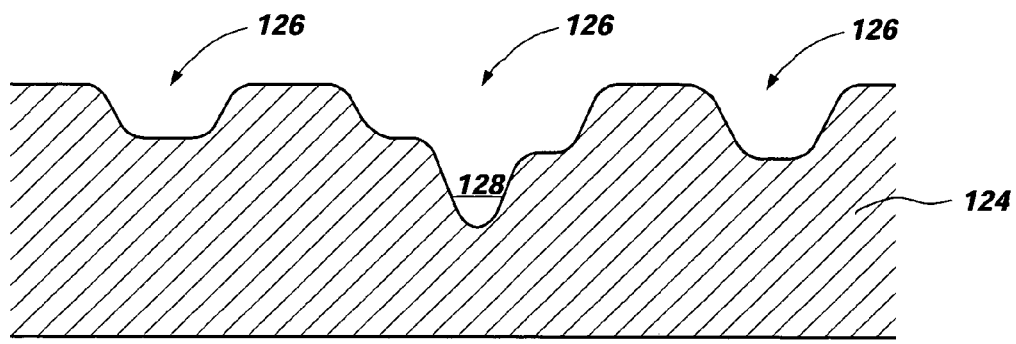

Subsequently, as shown in FIG. 5C, the semiconductor substrate 124 may be etched to clean up the trace depressions 126 and vias 128 and to smooth the shape thereof. Conventional wet or dry etch techniques, as previously listed, may be utilized.

Figure 5D:
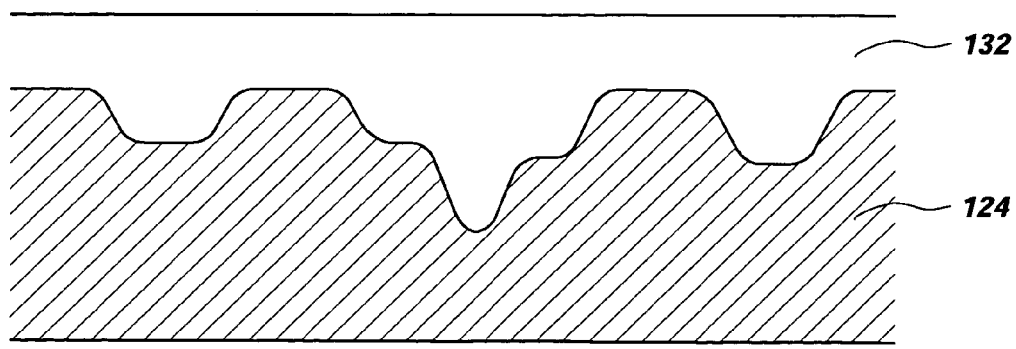
Figure 5E:
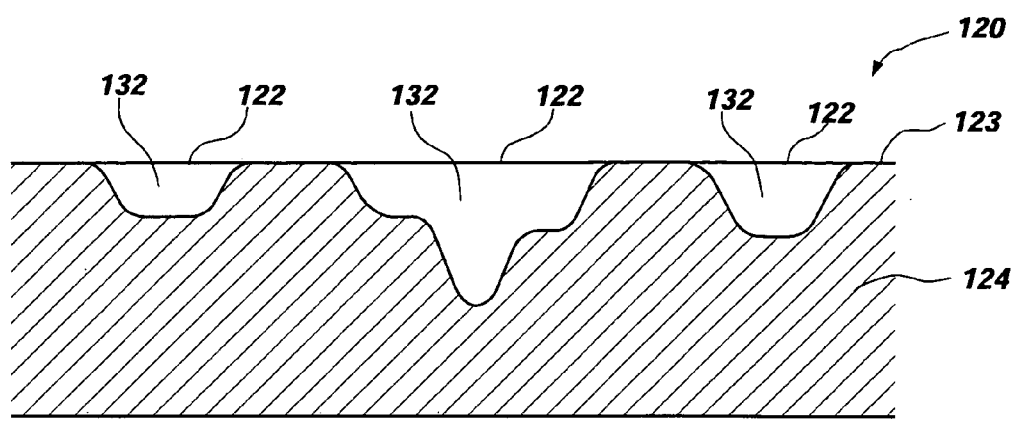

An electrically conductive material 132 may subsequently be deposited using, e.g., CVD, over the etched semiconductor substrate 124 such that the trace depressions 126 and vias 128 are filled therewith. This step is shown in FIG. 5D. Alternatively, a conductive polymer or conductive nanoparticles may be deposited. Next, as shown in FIG. 5E, the electrically conductive material 132 may be planarized by using, for instance, a mechanical abrasion technique, such as CMP, to laterally isolate the electrically conductive material 132 in the trace depressions 126 and vias 128.

Figure 5F:
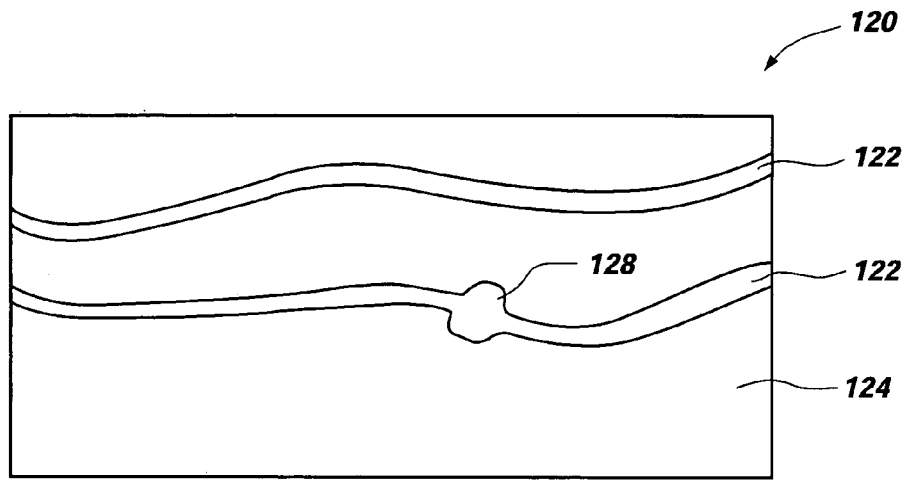
FIG. 5F is a top plan view of a semiconductor device having a plurality of filled elongated conductive elements in a semiconductor substrate thereof and a discrete conductive structure in association with and connected to one of the elongated conductive elements.

The above-described method results in a semiconductor device structure 120 which includes a plurality of traces 122 and one or more vias 128 in a semiconductor substrate 124 thereof (see, FIG. 5F).

A similar process sequence to that shown in FIGS. 5A-5E may be utilized to ablate one or more elongated conductive elements and one or more discrete conductive structures substantially simultaneously in a semiconductor film such as an interlevel dielectric layer 134. Referring to FIGS. 6A-6E, steps in an exemplary method according to the present invention for fabricating a semiconductor device structure 120' having a trace 122' in combination with a via 128' in the interlevel dielectric layer 134 thereof are illustrated. It will be understood and appreciated by those of ordinary skill in the art that while in the illustrated process the trace 122' and via 128' are formed in an interlevel dielectric layer 134, a similar process may also be utilized to form elongated conductive elements in other films, such as a passivation film (e.g., a silicon dioxide ($SiO_2$), silicon nitride ($Si_3N_4$), or parylene film).

Figure 6A:
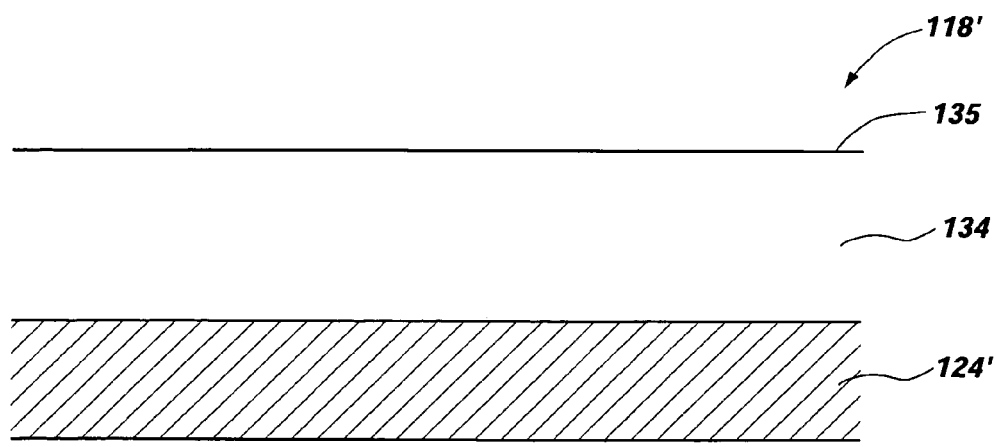
FIGS. 6A-6E are side cross-sectional views schematically illustrating a method (in accordance with the present invention) for forming elongated conductive elements in an interlevel dielectric layer concurrently with the formation of a discrete conductive structure.

Referring initially to FIG. 6A, a cross-sectional view of an intermediate structure 118' in the fabrication of a semiconductor device structure 120' having a plurality of traces 122' and one or more vias 128' formed in a surface 135 of the interlevel dielectric layer 134 thereof is shown. The intermediate structure 118' includes a semiconductor substrate 124', e.g., a silicon wafer, having an interlevel dielectric layer 134 (e.g., a $SiO_2$ layer) thereon. As with the example illustrated in FIGS. 4A-4E, the interlevel dielectric layer 134 may be deposited on the semiconductor substrate 124' using, for example, CVD techniques.

Figure 6B:
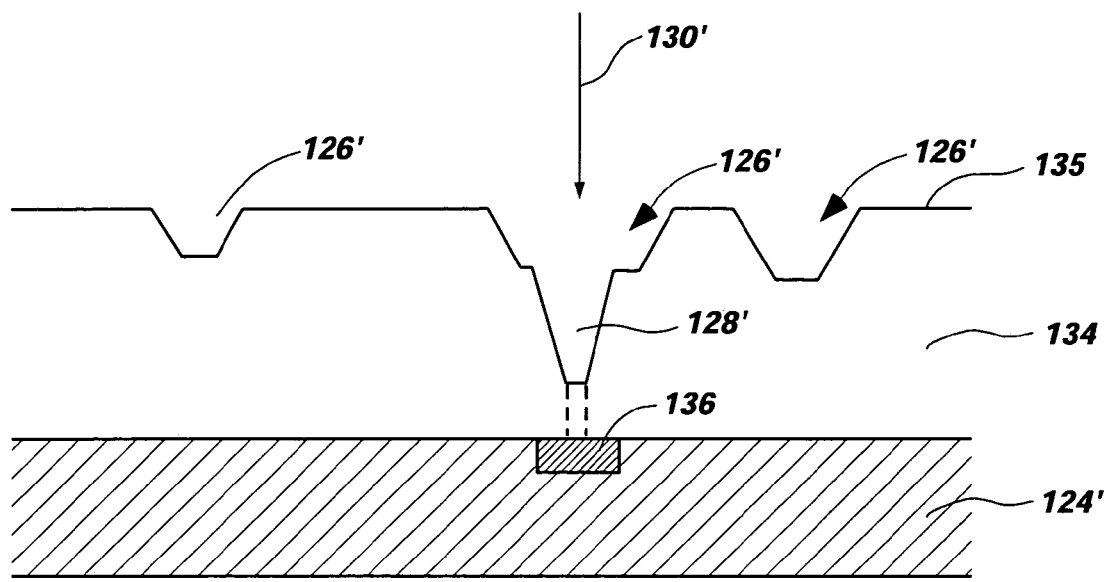

Subsequently, as shown in FIG. 6B, a desired pattern of elongated conductive element precursors in the form of one or more trace depressions 126' and one or more discrete conductive structure precursors, e.g., vias 128', may be formed in the surface 135 of the interlevel dielectric layer 134 using a focused laser beam 130'. The trace depressions 126' and vias 128' may be of any size, shape and depth suitable to define the desired conductive pathway. The vias 128' may extend through the full thickness of the interlevel dielectric layer 134, as shown in broken lines in FIG. 6B, such that the semiconductor substrate 124', including any active areas 136 thereon, may be contacted through the vias 128'. Alternatively, and as shown in solid lines in FIGS. 6B-6E, the vias 128' may extend into the interlevel dielectric layer 134 a depth less than the thickness of the interlevel dielectric layer 134. As a further option, the vias 128' may be extended into and even through the semiconductor substrate 124' (embodiment not shown).

Figure 6C:
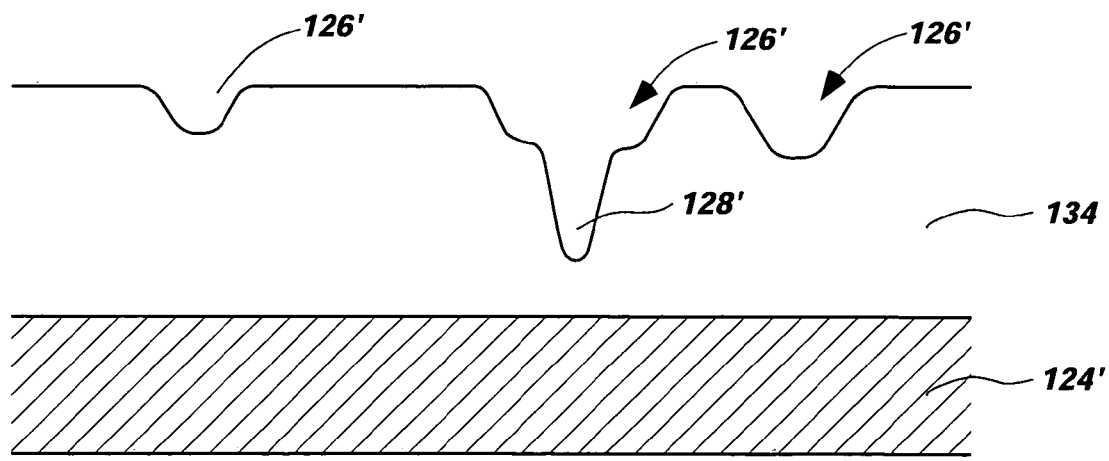

Subsequently, as shown in FIG. 6C, the interlevel dielectric layer 134 may be etched to clean up the trace depressions 126' and vias 128' and to smooth the shape thereof. Conventional wet or dry etch techniques, as previously listed, may be utilized.

Figure 6D:
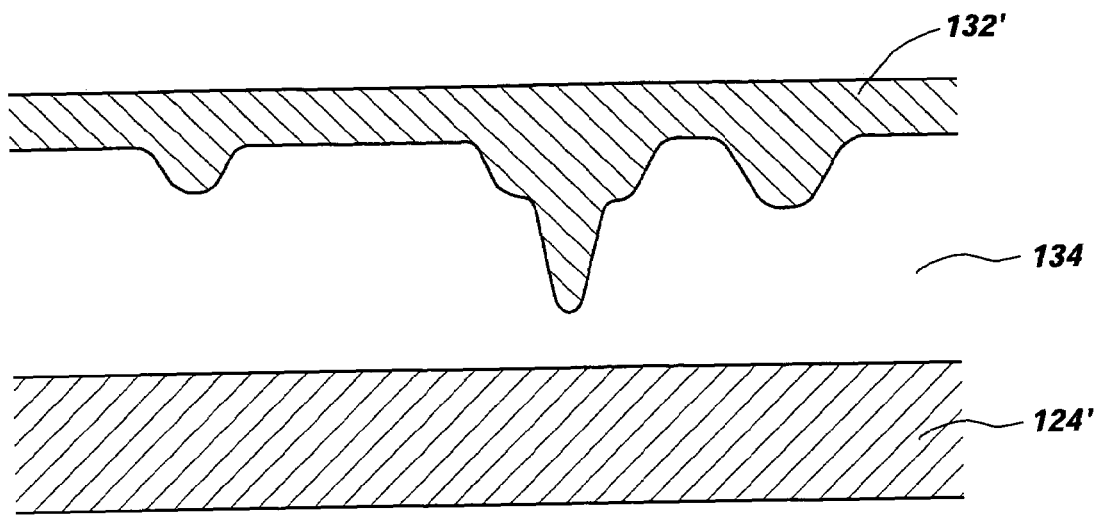

An electrically conductive material 132' may subsequently be deposited using, e.g., CVD, over the etched interlevel dielectric layer 134 such that the trace depressions 126' and vias 128' are filled therewith. This step is shown in FIG. 6D. Alternatively, a conductive polymer may be deposited.

Figure 6E:
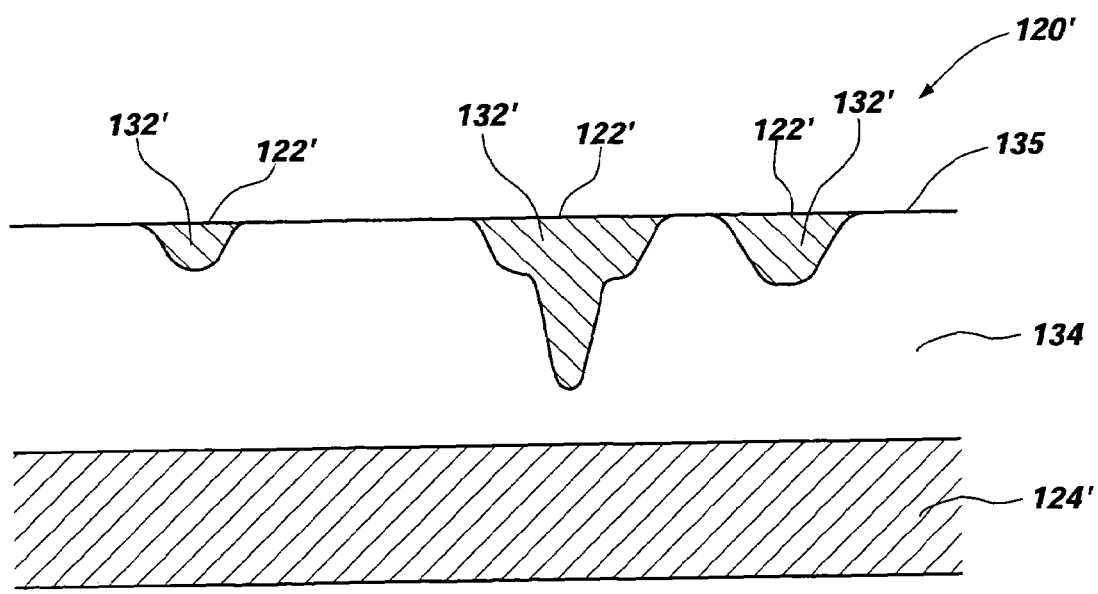

Next, as shown in FIG. 6E, the electrically conductive material 132' may be planarized by using, for instance, a mechanical abrasion technique, such as CMP, to laterally isolate the electrically conductive material 132' in the trace depressions 126' and vias 128'. If desired, and if the vias 128' are not formed entirely through the semiconductor substrate 124', the semiconductor substrate 124' may be back-ground or etched back to expose the electrically conductive material 132' at the bottoms of the vias 128'.

Figure 6F:
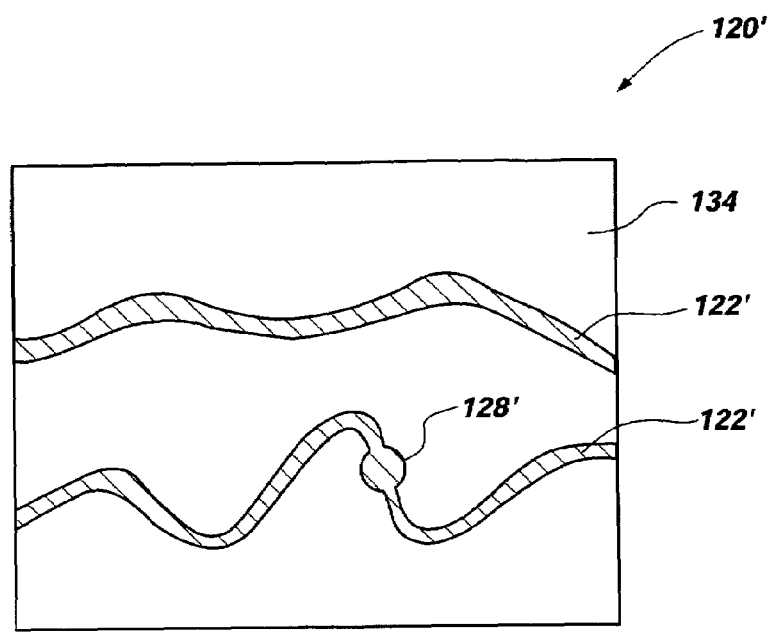
FIG. 6F is a top plan view of a semiconductor device having a plurality of filled elongated conductive elements in an interlevel dielectric layer thereof and a discrete conductive structure in association with and connected to one of the elongated conductive elements.

The above-described method results in a semiconductor device structure 120' which includes a plurality of traces 122' and one or more filled vias 128' in a single interlevel dielectric layer 134 thereof (see, FIG. 6F).

The above-described method requires fewer processing steps than conventional dual damascene processes and, in part because there are no photolithography steps, the method offers a lower cost alternative to conventional dual damascene processes. Further, the method of the present invention enables the formation of one or more elongated conductive elements or structures substantially simultaneously in a single layer, each such element or structure having a varying size and shape to maximize use of the substrate or film. Still further, the method provides a simple process for altering a desired electrical pattern, prior to ablation, as a new pattern merely must be programmed into the laser machining apparatus. That is, no new masks are required rendering the present invention easier and more convenient than conventional mask and etch techniques.

The present invention has been described in relation to particular embodiments that are intended in all respects to be illustrative rather than restrictive. It is to be understood that the invention defined by the appended claims is not to be limited by particular details set forth in the above description and that alternative embodiments will become apparent to those of ordinary skill in the art to which the present invention pertains without departing from the spirit and scope thereof.

Having thus described the invention, what is claimed is:

1. A method for creating at least one electrical pathway in a semiconductor device structure, comprising:
   providing a semiconductor substrate;
   ablating one or more depressions elongated to a length in a direction substantially parallel to a surface of the semiconductor substrate in and along the surface to define at least one electrical pathway extending along the surface, the length of each depression of the one or more depressions being greater than a width of each respective depression of the one or more depressions;
   depositing an electrically conductive material over the surface of the semiconductor substrate and into the one or more depressions; and
   planarizing the electrically conductive material at least to the surface of the semiconductor substrate to laterally isolate the electrically conductive material in the one or more depressions.

2. The method of claim 1, further comprising etching the one or more depressions in the surface of the semiconductor substrate subsequent to ablating and prior to depositing the electrically conductive material over the surface of the semiconductor substrate.

3. The method of claim 1, wherein providing the semiconductor substrate comprises providing at least one of a silicon wafer, a silicon on insulator substrate, a silicon on sapphire substrate, an epitaxial layer of silicon on a base semiconductor foundation, a substrate comprising a layer of silicon-germanium, a substrate comprising a layer of germanium, a substrate comprising a layer of gallium arsenide and a substrate comprising a layer of indium phosphide.

4. The method of claim 1, wherein depositing the electrically conductive material over the surface of the semiconductor substrate comprises depositing at least one of a metal, a conductive polymer and conductive nano-particles over the surface of the semiconductor substrate.

5. The method of claim 4, wherein depositing the at least one of the metal, the conductive polymer and the conductive nano-particles over the surface of the semiconductor substrate comprises depositing a metal selected from the group consisting of solder, aluminum, titanium, nickel, iridium, copper, gold, tungsten, silver, platinum, palladium, tantalum, molybdenum and alloys thereof over the surface of the semiconductor substrate.

6. The method of claim 4, wherein depositing the at least one of the metal, the conductive polymer and the conductive nano-particles over the surface of the semiconductor substrate comprises depositing a conductive polymer selected from the group consisting of a metal filled silicone and an isotropically conductive or conductor-filled epoxy over the surface of the semiconductor substrate.

7. The method of claim 1, wherein providing the semiconductor substrate comprises providing the semiconductor substrate and forming a film over at least a portion of the surface of the semiconductor substrate, and wherein ablating one or more depressions in the surface of the semiconductor substrate comprises ablating the one or more depressions at least partially through the film.

8. The method of claim 7, further comprising:
   depositing an electrically conductive material over a surface of the film and into the one or more depressions; and
   planarizing the electrically conductive material at least to the surface of the film to laterally isolate the electrically conductive material in the one or more depressions.

9. The method of claim 8, further comprising etching the one or more depressions in the film subsequent to ablating and prior to depositing the electrically conductive material over the surface of the film.

10. A method for creating at least one conductive element and at least one conductive structure in a semiconductor device structure, comprising:
   providing a semiconductor substrate; and
   substantially simultaneously ablating at least one depression elongated to a length in a direction substantially parallel to a surface of the semiconductor substrate in and along the surface to define a path for at least one conductive element in the form of an elongated trace extending along the surface of the semiconductor substrate, the length being greater than a width of the at least one depression, and ablating at least another depression in and transverse to the surface of the semiconductor substrate comprising a via extending into the semiconductor substrate.

11. The method of claim 10, further comprising:
depositing an electrically conductive material over the surface of the semiconductor substrate and into the at least one depression and the at least another depression; and
planarizing the electrically conductive material at least to the surface of the semiconductor substrate to laterally isolate the electrically conductive material in the at least one depression and the at least another depression.

12. The method of claim 11, further comprising etching the at least one depression and the at least another depression in the surface of the semiconductor substrate subsequent to ablating and prior to depositing the electrically conductive material over the surface of the semiconductor substrate.

13. The method of claim 10, wherein providing the semiconductor substrate comprises providing at least one of a silicon wafer, a silicon on insulator substrate, a silicon on sapphire substrate, an epitaxial layer of silicon on a base semiconductor foundation, a substrate comprising a layer of silicon-germanium, a substrate comprising a layer of germanium, a substrate comprising a layer of gallium arsenide and a substrate comprising a layer of indium phosphide.

14. The method of claim 11, wherein depositing the electrically conductive material over the surface of the semiconductor substrate comprises depositing at least one of a metal, a conductive polymer and conductive nano-particles over the surface of the semiconductor substrate.

15. The method of claim 14, wherein depositing the at least one of the metal, the conductive polymer and conductive nano-particles over the surface of the semiconductor substrate comprises depositing a metal selected from the group consisting of solder, aluminum, titanium, nickel, iridium, copper, gold, tungsten, silver, platinum, palladium, tantalum, molybdenum and alloys thereof over the surface of the semiconductor substrate.

16. The method of claim 14, wherein depositing the at least one of the metal, the conductive polymer and conductive nano-particles over the surface of the semiconductor substrate comprises depositing a conductive polymer selected from the group consisting of a metal filled silicone and an isotropically conductive or conductor-filled epoxy over the surface of the semiconductor substrate.

17. The method of claim 10, wherein providing the semiconductor substrate comprises providing the semiconductor substrate and forming a film over at least a portion of the surface of the semiconductor substrate, and wherein ablating at least one depression and at least another depression in the surface of the semiconductor substrate comprises ablating the at least one depression and the at least another depression at least partially through the film.

18. The method of claim 17, wherein ablating at least one depression and at least another depression at least partially through the film comprises ablating the at least one conductive structure precursor through the film to expose an active area on the surface of the semiconductor substrate.

19. The method of claim 17, further comprising:
depositing an electrically conductive material over a surface of the film and into the at least one depression and the at least another depression; and
planarizing the electrically conductive material at least to the surface of the film to laterally isolate the electrically conductive material in the at least one depression and the at least another depression.

20. The method of claim 19, further comprising etching the at least one depression and the at least another depression subsequent to ablating and prior to depositing the electrically conductive material over the surface of the film.

21. A method for creating at least one electrical connection through a sidewall of a semiconductor device structure, comprising:
providing a semiconductor substrate having an active surface, a backside surface, and at least one sidewall oriented substantially perpendicular to the active surface and the backside surface; and
ablating one or more depressions in a surface of the at least one sidewall of the semiconductor substrate to define at least one electrical connection.

22. The method of claim 21, further comprising:
depositing an electrically conductive material over the surface of the at least one sidewall of the semiconductor substrate and into the one or more depressions; and
planarizing the electrically conductive material at least to the surface of the at least one sidewall of the semiconductor substrate to laterally isolate the electrically conductive material in the one or more depressions.

23. The method of claim 22, further comprising etching the one or more depressions in the surface of the at least one sidewall of the semiconductor substrate subsequent to ablating and prior to depositing the electrically conductive material over the surface of the at least one sidewall of the semiconductor substrate.

24. The method of claim 21, wherein providing the semiconductor substrate comprises providing the semiconductor substrate and forming a film over at least a portion of the surface of the at least one sidewall of the semiconductor substrate, and wherein ablating one or more depressions in the surface of the at least one sidewall of the semiconductor substrate comprises ablating the one or more depressions at least partially through the film.

25. The method of claim 24, further comprising:
depositing an electrically conductive material over a surface of the film and into the one or more depressions; and
planarizing the electrically conductive material at least to the surface of the film to laterally isolate the electrically conductive material in the one or more depressions.

26. The method of claim 25, further comprising etching the one or more depressions subsequent to ablating and prior to depositing the electrically conductive material over the surface of the film.

27. The method of claim 1, wherein ablating one or more depressions in the surface of the semiconductor substrate further comprises:
providing a laser configured to emit a laser beam; and
traversing the surface of the semiconductor substrate with the laser beam.

* * * * *